United States Patent
Saida et al.

(10) Patent No.: US 7,638,071 B2
(45) Date of Patent: Dec. 29, 2009

(54) CROSSLINKED SELF-DOPING TYPE ELECTRICALLY CONDUCTING POLYMER, PRODUCTION PROCESS THEREOF, PRODUCT COATED WITH THE POLYMER AND ELECTRONIC DEVICE

(75) Inventors: Yoshihiro Saida, Nagano (JP); Takashi Ohkubo, Chiba (JP)

(73) Assignee: Showa Denko K.K., Tokyo (JP)

( * ) Notice: Subject to any disclaimer, the term of this patent is extended or adjusted under 35 U.S.C. 154(b) by 263 days.

(21) Appl. No.: 10/593,498

(22) PCT Filed: Mar. 23, 2005

(86) PCT No.: PCT/JP2005/005996

§ 371 (c)(1),
(2), (4) Date: Sep. 20, 2006

(87) PCT Pub. No.: WO2005/091309

PCT Pub. Date: Sep. 29, 2005

(65) Prior Publication Data

US 2007/0194285 A1    Aug. 23, 2007

Related U.S. Application Data

(60) Provisional application No. 60/558,555, filed on Apr. 2, 2004, provisional application No. 60/608,873, filed on Sep. 13, 2004.

(30) Foreign Application Priority Data

Mar. 24, 2004 (JP) ............................. 2004-087370
Sep. 3, 2004 (JP) ............................. 2004-257435

(51) Int. Cl.
*H01B 1/10* (2006.01)
*H01B 1/12* (2006.01)

(52) U.S. Cl. ............... 252/500; 252/519.2; 252/519.34; 252/521.6; 528/373; 528/377; 528/378; 528/379; 528/380

(58) Field of Classification Search .................. 252/500, 252/519.2, 519.34, 521.6; 528/373, 377, 528/378, 379, 380

See application file for complete search history.

(56) References Cited

U.S. PATENT DOCUMENTS

| | | | | |
|---|---|---|---|---|
| 5,498,372 A * | 3/1996 | Hedges | ........................ | 252/511 |
| 5,637,652 A * | 6/1997 | Kato et al. | .................. | 525/389 |
| 5,648,453 A * | 7/1997 | Saida et al. | .................. | 528/380 |
| 5,688,873 A * | 11/1997 | Saida et al. | .................. | 525/410 |
| 6,132,645 A * | 10/2000 | Hedges | ........................ | 252/510 |
| 6,593,399 B1 * | 7/2003 | La Fleur et al. | ............. | 523/201 |
| 6,825,357 B2 * | 11/2004 | Rauchschwalbe et al. | ..... | 549/43 |
| 2007/0129534 A1 * | 6/2007 | Ohata et al. | .................. | 528/373 |
| 2007/0181857 A1 * | 8/2007 | Nishioka et al. | ............ | 252/500 |
| 2007/0231604 A1 * | 10/2007 | Ohkubo et al. | .............. | 428/704 |
| 2007/0252111 A1 * | 11/2007 | Ohkubo et al. | .............. | 252/500 |
| 2008/0193730 A1 * | 8/2008 | Ohkubo et al. | .............. | 428/220 |

FOREIGN PATENT DOCUMENTS

| | | |
|---|---|---|
| EP | 0 545 417 A1 | 6/1993 |
| JP | 2-189333 A | 7/1990 |
| JP | 3-221520 A | 9/1991 |
| JP | 6-49183 A | 2/1994 |
| JP | 7-48436 A | 2/1995 |
| JP | 7-196791 A | 8/1995 |
| JP | 8-157575 A | 6/1996 |
| JP | 8-259673 A | 10/1996 |
| JP | 10-1665 A | 1/1998 |
| JP | 10-168328 A | 6/1998 |
| JP | 2000-186218 A | 7/2000 |
| JP | 2001-98069 A | 4/2001 |
| JP | 2003-113246 A | 4/2003 |
| JP | 2004-134151 A | 4/2004 |

* cited by examiner

*Primary Examiner*—Douglas Mc Ginty
(74) *Attorney, Agent, or Firm*—Sughrue Mion, PLLC

(57) ABSTRACT

The invention relates to a self-doping type electrically conducting polymer comprising an isothianaphthene or thiophene skeleton where the polymer chains are crosslinked preferably through a sulfone bond which is imparted with water resistance and solvent resistance; a production process thereof; an electrically conducting composition film obtained by coating a composition containing the self-doping type electrically conducting polymer on a substrate and heating it; a product coated using the composition; and an electronic device containing the self-doping type electrically conducting polymer.

33 Claims, 5 Drawing Sheets

(1)

(2)

(3)

(4)

: phosphorescence-emitting moiety

: carrier-transporting moiety

CROSSLINKED SELF-DOPING TYPE ELECTRICALLY CONDUCTING POLYMER, PRODUCTION PROCESS THEREOF, PRODUCT COATED WITH THE POLYMER AND ELECTRONIC DEVICE

CROSS-REFERENCE TO RELATED APPLICATIONS

This is an application filed pursuant to 35 U.S.C. Section 111(a) with claiming the benefit of U.S. provisional application Ser. No. 60/558,555 filed Apr. 2, 2004 and U.S. provisional application No. 60/608,873 filed Sep. 13, 2004 under the provision of 35 U.S.C. 111(b), pursuant to 35 U.S.C. Section 119(e)(1).

TECHNICAL FIELD

The present invention relates to a self-doping type electrically conducting polymer modified in the solvent resistance and mechanical properties without impairing the electrical properties, a production process thereof, an electrically conducting composition using the self-doping type electrically conducting polymer, a product coated with the self-doping type electrically conducting polymer, and an electronic device. As for the electronic device, more specifically, the present invention relates to an organic light-emitting element using the self-doping type electrically conducting polymer.

BACKGROUND ART

A self-doping type electrically conducting polymer is usually soluble in water and easily shapable or film-formable into an arbitrary shape and by virtue of such properties, production of a large-area film is facilitated and such a polymer, for its excellent processability, can be employed in production of electrical elements requiring high-precision processing technology.

In recent years, by taking advantage of these properties, self-doping type electrically conducting polymers are used for prevention of charge-up in lithography process using a charged particle beam such as electron beam or ion beam.

A method of imparting water resistance to a water-soluble self-doping type electrically conducting polymer is disclosed. More specifically, a method of performing a dehydration treatment for enhancing the water resistance of a water-soluble polythiophene-based self-doping type electrically conducting polymer is disclosed (see, JP-A-3-221520 (the term "JP-A" as used herein means an "unexamined published Japanese patent application")).

However, in this method, the water insolubility is attained by decreasing the amount of water contained, and the essential difference between the water-soluble self-doping type electrically conducting polymer and the water-insoluble self-doping type electrically conducting polymer is unclear since the document does not include description about it.

A method of heat-treating a substrate coated with a water-soluble aniline-based self-doping type electrically conducting polymer to obtain a water-resistant electric conductor is disclosed (see, JP-A-2001-98069).

However, in this method, the water resistance is imparted by eliminating a sulfonic acid group and/or a carboxyl group of the self-doping type electrically conducting polymer and therefore, the original electrical conductivity is disadvantageously liable to decrease. In particular, high temperature treatment, which causes decomposition of the self-doping type electrically conducting polymer itself, gives rise to a problem that the electrical conductivity is seriously decreased.

Also, a water-soluble polyisothianaphthene-based self-doping type electrically conducting polymer and a production process thereof are disclosed (see, JP-A-6-49183), but this aqueous solution is known to be affected by oxygen (see, JP-A-8-259673) and there is no known method for improving the water resistance and solvent resistance at present.

With respect to method for enhancing the water resistance and solvent resistance of an electrically conducting composition containing a self-doping type electrically conducting polymer, a method of adding a thermosetting matrix resin is disclosed in JP-A-2000-186218. In this method, a self-doping type electrically conducting polymer is used as a mixture with an insulating polymer and therefore the electrical conductivity decreases as compared with a case where a self-doping type electrically conducting polymer alone is used. Also, it is known that, in the case of using an electrically conducting composition as a coating film, since the coating film formed must have a large thickness so as to ensure predetermined electrical conductivity, transmission of the film thus formed is low as compared with a film formed of the self-doping type electrically conducting polymer alone.

Incidentally, an electronic device is used in the state that a self-doping type electrically conducting polymer-containing composition and various thin films are stacked. In this case, an electrically conducting polymer component of the electrically conducting polymer-containing composition or additives contained therein may dissolve out between the electrically conducting polymer composition layer and a thin film layer in contact therewith, or components of various thin film layers may dissolve out into the electrically conducting polymer composition layer, resulting in a problem that the performance of the electronic device seriously decreases. Thus, a material excellent in the solvent resistance as an electrically conducting composition is being demanded.

For example, the polymer-type organic light-emitting element developed to-date is typically constructed by providing anode(transparent)/anode buffer layer/light-emitting layer/cathode in this order on the transparent substrate and is used in the state that various thin films are stacked.

In this construction, the anode buffer layer is inserted for the purpose of flattening the anode surface to prevent an electrical short circuit or for the purpose of buffering the barrier against hole injection from the light-emitting layer into the anode. For this anode buffer, a mixture of poly(3,4-ethylenedioxythiophene) (PEDOT) which is an electrically conducting polymer material and polystyrenesulfonic acid (PSS) is being widely used at present.

Also, the present inventors have already proposed that a self-doping type electrically conducting polymer having an isothianaphthene skeleton showing weak acidity at 1% by mass is useful as the anode buffer layer.

In these techniques, the above-mentioned mixture of poly (3,4-ethylenedioxythiophene) (PEDOT) and polystyrenesulfonic acid (PSS) contains a sulfonic acid group in PSS working out to a dopant, and the self-doping type electrically conducting polymer also contains a sulfonic acid group in its molecular structure. Whichever of the electrically conducting polymers is used for the anode buffer layer, there remains another problem that water embraced as a crystal water in the sulfonic acid group is released in the device to deteriorate the element, which should be solved to avoid the deterioration.

Intensive studies are being made on such a problem regarding deterioration resulting from movement of water. In particular, a method of providing a barrier layer to prevent water present in ambient air which permeates into the element from reaching the light-emitting layer is disclosed (see JP-A-2004-134151).

DISCLOSURE OF THE INVENTION

A first object of the present invention is to provide a self-doping type electrically conducting polymer having solvent resistance and mechanical properties with polymer chains being crosslinked, in place of a self-doping type electrically conducting polymer incapable of exhibiting solvent resistance and mechanical properties without greatly decreasing electrical conductivity, and a production process of the polymer.

A second object of the present invention is to provide a product coated with the self-doping type electrically conducting polymer imparted with solvent resistance and mechanical properties by having crosslinked polymer chains, and an electronic device using it, more specifically, an organic light-emitting element.

The present inventors have found that the solvent resistance and mechanical properties can be obtained by partially crosslinking self-doping type electrically conducting polymers, and accomplished the present invention.

In particular, by crosslinking isothianaphthene skeleton-containing electrically conducting polymers, the solvent resistance and mechanical properties can be imparted without losing the electrical properties.

Furthermore, by crosslinking 3-position substituted thiophene skeleton-containing electrically conducting polymers, the solvent resistance and mechanical properties can be imparted without greatly impairing the electrical properties.

It has been found that the self-doping type electrically conducting polymer containing an isothianaphthene skeleton having a sulfonic, acid group does not decompose by heating for a short time and when heated at a high temperature, undergoes crosslinking and changes into a self-doping type electrically conducting polymer having high solvent resistance and excellent strength. This is considered to occur due to dehydration reaction between the sulfonic acid group and a hydrogen atom in the aromatic ring of another isothianaphthene under heating and the resulting generation of sulfone bond.

Furthermore, the present inventors have found that also a self-doping type electrically conducting polymer containing a thiophene skeleton having a sulfonic acid group substituted at the 3-position of the thiophene structure directly or through a side chain undergoes crosslinking when heated at a high temperature, and changes into a self-doping type electrically conducting polymer having high solvent resistance and excellent strength. This is considered to occur due to dehydration reaction between the sulfonic acid group and a hydrogen atom at the 4-position of the thiophene whose 3-position is substituted and the resulting generation of sulfone bond.

That is, the present invention relates to a self-doping type electrically conducting polymer, a production process thereof, an electrically conducting composition containing the electrically conducting polymer, a product coated with the electrically conducting polymer, an electronic device using the electrically conducting polymer, and the like, which are described below.

More specifically, the present invention includes the following inventions.

1. A self-doping type electrically conducting polymer comprising crosslinked polymer chains.

2. The self-doping type electrically conducting polymer as described in 1 above, which has a sulfonic acid group.

3. The self-doping type electrically conducting polymer as described in 1 or 2 above, wherein the crosslinking is formed through a sulfone bond and the sulfone bond is contained in an amount of from 1 to 90 mol % based on the repeating unit of the polymer.

4. The self-doping type electrically conducting polymer as described in any one of 1 to 3 above, wherein the polymer chains are crosslinked through a bond having a binding energy from 0.5 to 2 eV lower than the binding energy of the sulfonic acid group as measured by X-ray photoelectron spectrometry.

5. The self-doping type electrically conducting polymer as described in 1 or 2 above, which contains an isothianaphthene skeleton having a sulfonic acid group.

6. The self-doping type electrically conducting polymer as described in 5 above, wherein the crosslinked structure through a sulfone bond is a isothianaphthene structure represented by formula (1)

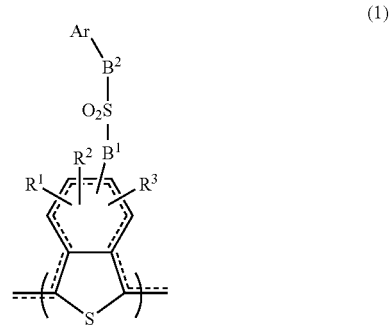

wherein $R^1$ to $R^3$ each independently represents a hydrogen atom, a linear or branched alkyl group having from 1 to 20 carbon atoms, a linear or branched alkoxy group having from 1 to 20 carbon atoms, a linear or branched alkenyl group having from 2 to 20 carbon atoms, a linear or branched alkenyloxy group having from 2 to 20 carbon atoms, a hydroxyl group, a halogen atom, a nitro group, a cyano group, a trihalomethyl group, a phenyl group, a substituted phenyl group or a $-B^1-SO_3^-M^+$ group, $B^1$ and $B^2$ each independently represents $-(CH_2)_p-(O)_q-(CH_2)_r-$, p and r each independently represents 0 or an integer of 1 to 3, q represents 0 or 1, Ar represents a monovalent aromatic group, a substituted monovalent aromatic group, a monovalent heterocyclic group or a substituted monovalent heterocyclic group, and $M^+$ represents a hydrogen ion, an alkali metal ion or a quaternary ammonium ion.

7. The self-doping type electrically conducting polymer as described in 6 above, wherein the crosslinked structure through a sulfone bond is a structure represented by formula (2):

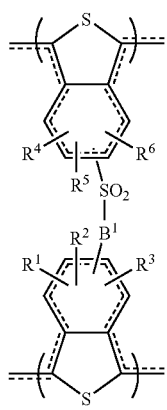

(2)

wherein $R^1$ to $R^6$ each independently represents a hydrogen atom, a linear or branched alkyl group having from 1 to 20 carbon atoms, a linear or branched alkoxy group having from 1 to 20 carbon atoms, a linear or branched alkenyl group having from 2 to 20 carbon atoms, a linear or branched alkenyloxy group having from 2 to 20 carbon atoms, a hydroxyl group, a halogen atom, a nitro group, a cyano group, a trihalomethyl group, a phenyl group, a substituted phenyl group or a —$B^1$—$SO_3^-M^+$ group, $B^1$ represents —$(CH_2)_p$—$(O)_q$—$(CH_2)_r$—, p and r each independently represents 0 or an integer of 1 to 3, q represents 0 or 1, and $M^+$ represents a hydrogen ion, an alkali metal ion or a quaternary ammonium ion.

8. The self-doping type electrically conducting polymer as described in 7 above, wherein the crosslinked structure through a sulfone bond is a structure represented by formula (3)

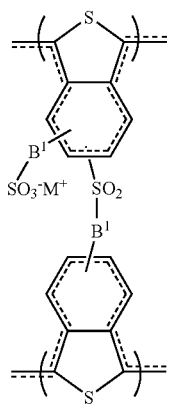

(3)

wherein $B^1$ represents —$(CH_2)_p$—$(O)_q$—$(CH_2)_r$—, p and r each independently represents 0 or an integer of 1 to 3, q represents 0 or 1, and $M^+$ represents a hydrogen ion, an alkali metal ion or a quaternary ammonium ion.

9. The self-doping type electrically conducting polymer as described in any one of 2 to 4 above, which contains a heterocyclic 5-membered ring skeleton having a sulfonic acid group.

10. The self-doping type electrically conducting polymer as described in 9 above, wherein the crosslinked structure through a sulfone bond contains a structure represented by formula (4)

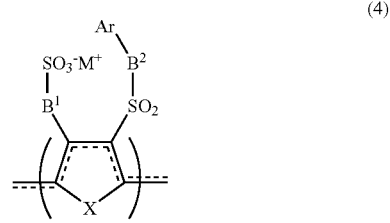

(4)

wherein X represents —S—, —O— or —N(—$R^{15}$)—, $R^{15}$ represents a hydrogen atom, a linear or branched alkyl group having from 1 to 20 carbon atoms, or a linear or branched alkenyl group having from 2 to 20 carbon atoms, $B^1$ and $B^2$ each independently represents —$(CH_2)_p$—$(O)_q$—$(CH_2)_r$—, p and r each independently represents 0 or an integer of 1 to 3, q represents 0 or 1, Ar represents a monovalent aromatic group, a substituted monovalent aromatic group, a monovalent heterocyclic group or a substituted monovalent heterocyclic group, and $M^+$ represents a hydrogen ion, an alkali metal ion or a quaternary ammonium ion.

11. The self-doping type electrically conducting polymer as described in 10 above, wherein the crosslinked structure through a sulfone bond is a structure represented by formula (5)

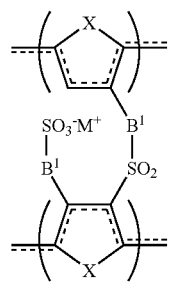

(5)

wherein X represents —S—, —O— or —N(—$R^{15}$)—, $R^{15}$ represents a hydrogen atom, a linear or branched alkyl group having from 1 to 20 carbon atoms, or a linear or branched alkenyl group having from 2 to 20 carbon atoms, $B^1$ represents —$(CH_2)_p$—$(O)_q$—$(CH_2)_r$—, p and r each independently represents 0 or an integer of 1 to 3, q represents 0 or 1, and $M^+$ represents a hydrogen ion, an alkali metal ion or a quaternary ammonium ion.

12. The self-doping type electrically conducting polymer as described in 11 above, wherein the crosslinked structure through a sulfone bond is a structure represented by formula (6)

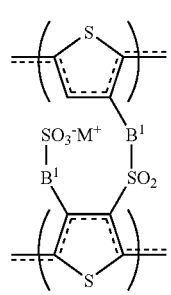

(6)

wherein $B^1$ represents —$(CH_2)_p$—$(O)_q$—$(CH_2)_r$—, p and r each independently represents 0 or an integer of 1 to 3, q represents 0 or 1, and $M^+$ represents a hydrogen ion, an alkali metal ion or a quaternary ammonium ion.

13. A process for producing the self-doping type electrically conducting polymer containing a crosslinked structure through a sulfone bond represented by formula (2) described in 7 above, comprising dehydration-condensing self-doping type electrically conducting polymers having a structure represented by formula (7)

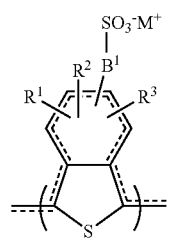

(7)

wherein $R^1$ to $R^3$ each independently represents a hydrogen atom, a linear or branched alkyl group having from 1 to 20 carbon atoms, a linear or branched alkoxy group having from 1 to 20 carbon atoms, a linear or branched alkenyl group having from 2 to 20 carbon atoms, a linear or branched alkenyloxy group having from 2 to 20 carbon atoms, a hydroxyl group, a halogen atom, a nitro group, a cyano group, a trihalomethyl group, a phenyl group, a substituted phenyl group or a —$B^1$—$SO_3^-M^+$ group, with the proviso that at least one of $R^1$ to $R^3$ is a hydrogen atom, $B^1$ represents —$(CH_2)_p$—$(O)_q$—$(CH_2)_r$—, p and r each independently represents 0 or an integer of 1 to 3, q represents 0 or 1, and $M^+$ represents a hydrogen ion, an alkali metal ion or a quaternary ammonium ion.

14. A process for producing the self-doping type electrically conducting polymer containing a crosslinked structure through a sulfone bond represented by formula (2) described in 7 above, comprising dehydration-condensing self-doping type electrically conducting polymers having a structure represented by formula (7) and/or formula (8):

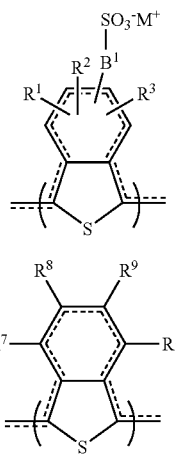

(7)

(8)

wherein $R^1$ to $R^3$ and $R^7$ to $R^{10}$ each independently represents a hydrogen atom, a linear or branched alkyl group having from 1 to 20 carbon atoms, a linear or branched alkoxy group having from 1 to 20 carbon atoms, a linear or branched alkenyl group having from 2 to 20 carbon atoms, a linear or branched alkenyloxy group having from 2 to 20 carbon atoms, a hydroxyl group, a halogen atom, a nitro group, a cyano group, a trihalomethyl group, a phenyl group, a substituted phenyl group or a —$B^1$—$SO_3^-M^+$ group, with the proviso that at least one of $R^7$ to $R^{10}$ is a hydrogen atom, $B^1$ represents —$(CH_2)_p$—$(O)_q$—$(CH_2)_r$—, p and r each independently represents 0 or an integer of 1 to 3, q represents 0 or 1, and $M^+$ represents a hydrogen ion, an alkali metal ion or a quaternary ammonium ion.

15. A process for producing the self-doping type electrically conducting polymer containing a crosslinked structure through a sulfone bond represented by formula (3) described in 8 above, comprising dehydration-condensing self-doping type electrically conducting polymers obtained by (co)polymerizing a monomer represented by formula (9):

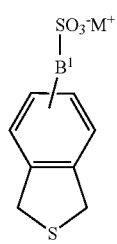

(9)

wherein $B^1$ represents —$(CH_2)_p$—$(O)_q$—$(CH_2)_r$—, p and r each independently represents 0 or an integer of 1 to 3, q represents 0 or 1, and $M^+$ represents a hydrogen ion, an alkali metal ion or a quaternary ammonium ion.

16. The process for producing a self-doping type electrically conducting polymer as described in any one of 13 to 15 above, wherein the dehydration condensation reaction is performed by a heat treatment at a temperature range of 210 to 350° C.

17. A process for producing the self-doping type electrically conducting polymer containing a crosslinked structure through a sulfone bond represented by formula (6) described in 12 above, the process comprising dehydration-condensing self-doping type electrically conducting polymers containing a structure represented by formula (10)

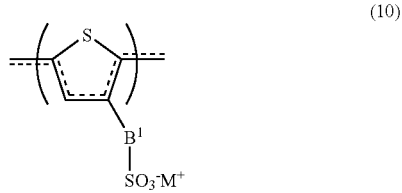
(10)

wherein $B^1$ represents —$(CH_2)_p$—$(O)_q$—$(CH_2)_r$—, p and r each independently represents 0 or an integer of 1 to 3, q represents 0 or 1, and $M^+$ represents a hydrogen ion, an alkali metal ion or a quaternary ammonium ion.

18. A process for producing the self-doping type electrically conducting polymer containing a crosslinked structure through a sulfone bond represented by formula (6) described in 12 above, comprising dehydration-condensing self-doping type electrically conducting polymers obtained by (co)polymerizing a monomer represented by formula (11)

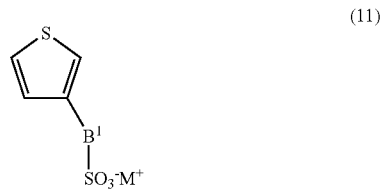
(11)

wherein $B^1$ represents —$(CH_2)_p$—$(O)_q$—$(CH_2)_r$—, p and r each independently represents 0 or an integer of 1 to 3, q represents 0 or 1, and $M^+$ represents a hydrogen ion, an alkali metal ion or a quaternary ammonium ion.

19. A self-doping type electrically conducting polymer obtained by the production process described in any one of 13 to 18 above.

20. An Electrically Conducting Composition Comprising the self-doping type electrically conducting polymer described in any one of 1 to 12 and 19 above, and a solvent.

21. A method for producing an electrically conducting film, comprising coating the electrically conducting composition described in 20 above on a substrate and heating it.

22. The method for producing an electrically conducting film as described in 21 above, wherein the self-doping type electrically conducting polymer having a structure represented by formula (7) and/or formula (8) described in 14 above is applied onto a substrate surface and then the substrate is heated at a temperature of 210 to 350° C. for 1 to 600 seconds.

23. The method for producing an electrically conducting film as described in 21 above, wherein the self-doping type electrically conducting polymer having a structure represented by formula (10) described in 17 above is applied onto a substrate surface and then the substrate is heated at a temperature of 120 to 250° C. for 1 to 600 seconds.

24. An electrically conducting film produced by the method described in any one of 21 to 23 above.

25. The electrically conducting film as described in 24 above, wherein the film thickness is from 1 to 1,000 nm.

26. A coated product comprising a shaped body having coated on the surface thereof the self-doping type electrically conducting polymer described in any one of 1 to 12 and 19 above.

27. A coated product comprising a substrate as a shaped body, wherein one surface, both surfaces or the entire surface of the substrate is coated with the self-doping type electrically conducting polymer described in any one of 1 to 12 and 19 above.

28. A coated product comprising a substrate as a shaped body, wherein one surface, both surfaces or the entire surface of the substrate is coated with the electrically conducting composition described in 20 above.

29. The coated product as described in 27 or 28 above, wherein the substrate is a silicon wafer.

30. The coated product as described in 27 or 28 above, wherein the substrate is entirely or partially coated with indium tin oxide.

31. An electronic device comprising the self-doping type electrically conducting polymer described in any one of 1 to 12 and 19 above.

32. An electronic device comprising the electrically conducting composition described in 20 above.

33. An organic light-emitting element comprising at least one light-emitting layer between a pair of anode and cathode, wherein the self-doping type electrically conducting polymer described in any one of 1 to 12 and 19 above is contained in the anode buffer layer.

34. The organic light-emitting element as described in 33 above, wherein the self-doping type electrically conducting polymer has a sulfonic acid group.

35. The organic light-emitting element as described in 33 or 34 above, wherein the self-doping type electrically conducting polymers are crosslinked through a sulfone bond.

36. An organic light-emitting element comprising the self-doping type electrically conducting polymer described in any one of 1 to 12 and 19 above.

37. An organic light-emitting element comprising the electrically conducting composition described in 20 above.

38. The organic light-emitting element as described in 33 above, wherein the light-emitting layer comprises a fluorescence-emitting polymer material.

39. The organic light-emitting element as described in 33 above, wherein the light-emitting layer comprises a phosphorescence-emitting polymer material.

40. An organic EL display comprising the organic light-emitting element described in any one of 33 to 39 above.

41. A display device for portable terminals, comprising the organic EL display described in 40 above.

DETAILED DESCRIPTION OF THE INVENTION

Figure 1:
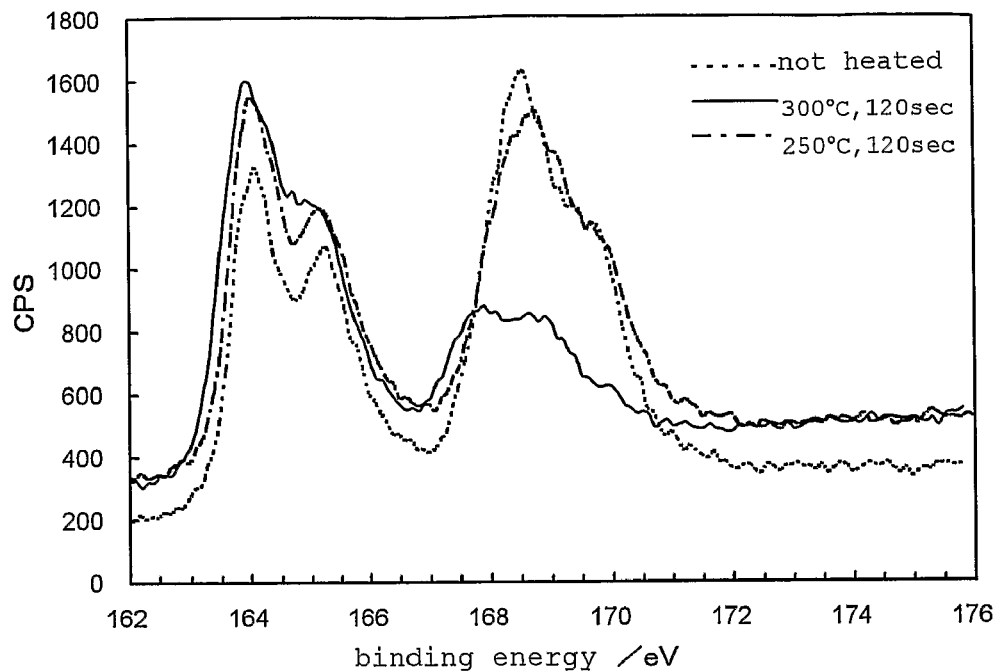
FIG. 1 shows a spectrum of binding energy of S2p obtained when the coating film of Electrically Conducting Composition 1 was measured by XPS; the dotted line is a spectrum for electrically conducting composition film before heat treatment (not heated), the one-dot chain line is a spectrum for electrically conducting composition film after heat treatment (250° C., 120 seconds) produced in Example 2, and the solid line is a spectrum for electrically conducting composition film after heat treatment (300° C., 120 seconds) produced in Example 4.

In conventional methods of imparting solvent resistance, particularly, water resistance, to a self-doping type electrically conducting polymer, the water resistance is elevated by heat-treating a water-soluble polyaniline-based self-doping type electrically conducting polymer at about 200° C. for about 15 minutes, thereby partially eliminating a carboxylic acid group, a sulfonic acid group or the like of the electrically conducting polymer.

However, the heat treatment at a high temperature is known to cause decomposition of the substance itself and in turn reduction of the surface resistance value which is an essentially required property.

The present inventors have found that when such a water-soluble self-doping type electrically conducting polymer is partially crosslinked, the solvent resistance can be enhanced without accompanying great reduction in the electrical conductivity.

As for the crosslinking method, any method may be used, however, if a crosslinkable monomer is used and polymerized, the originally required solubility in a solvent such as water decreases and therefore, it is preferable to employ a method where crosslinking reaction is performed after coating the polymer in the form of solution.

In the self-doping type electrically conducting polymer containing a water-soluble isothianaphthene skeleton, some sulfonic acid groups are condensed with benzene rings of other isothianaphthenes to produce a crosslinked structure under heating at 300° C. for a short time (within 5 minutes) and the water resistance is increased without causing reduction in the electrical properties.

In this way, by crosslinking the polymer chains of self-doping type electrically conducting polymers containing an isothianaphthene skeleton, not only the water resistance but also the solvent resistance are enhanced. Basically, the crosslinking method may be any method, but a polyisothianaphthene-based self-doping type electrically conducting polymer having a crosslinked structure through a sulfone bond is excellent not only in the heat resistance and water resistance but also in the solvent resistance.

More specifically, the crosslinked self-doping type electrically conducting polymer in a preferred embodiment of the present invention may have a Broensted acid group in at least one structural unit of repeating units of a π-electron conjugated polymer. Still more specifically, although the chemical structure is not limited, the crosslinked self-doping type electrically conducting polymer may have preferably a crosslinked structure through a sulfone bond, represented by formula (1).

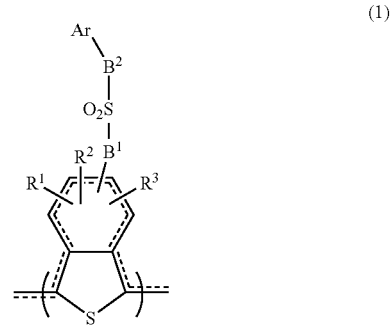

In formula (1), $R^1$ to $R^3$ each independently represents a hydrogen atom, a linear or branched alkyl group having from 1 to 20 carbon atoms, a linear or branched alkoxy group having from 1 to 20 carbon atoms, a linear or branched alkenyl group having from 2 to 20 carbon atoms, a linear or branched alkenyloxy group having from 2 to 20 carbon atoms, a hydroxyl group, a halogen atom, a nitro group, a cyano group, a trihalomethyl group, a phenyl group, a substituted phenyl group or a —$B^1$—$SO_3^-M^+$ group, $B^1$ and $B^2$ each represents —$(CH_2)_p$—$(O)_q$—$(CH_2)_r$—, p and r each independently represents 0 or an integer of 1 to 3, q represents 0 or 1, and $M^+$ represents a hydrogen ion, an alkali metal ion or a quaternary ammonium ion.

Further, Ar in formula (1) represents a monovalent aromatic group, a substituted monovalent aromatic group, a monovalent heterocyclic group or a substituted monovalent heterocyclic group. More specifically, preferred examples thereof include phenyl group, substituted phenyl group, naphthyl group, substituted naphthyl group, anthranyl group, substituted anthranyl group, quinolyl group, substituted quinolyl group, quinoxalyl group, substituted quinoxalyl group, thienyl group, substituted thienyl group, pyrrolyl group, substituted pyrrolyl group, furanyl group, substituted furanyl group, isothianaphthenylene group, substituted isothianaphthenylene group, carbazolyl group and substituted carbazolyl group. Particularly preferred are phenyl group, substituted phenyl group, naphthyl group, substituted naphthyl group, quinoxalyl group, substituted quinoxalyl group, thienyl group, substituted thienyl group, pyrrolyl group, substituted pyrrolyl group, isothianaphthenylene group and substituted isothianaphthenylene group.

More preferably, the polymer may be a polymer containing a crosslinked structure through a sulfone bond as represented by formula (2):

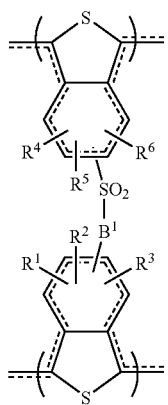

(2)

In formula (2), $R^1$ to $R^6$ each independently represents a hydrogen atom, a linear or branched alkyl group having from 1 to 20 carbon atoms, a linear or branched alkoxy group having from 1 to 20 carbon atoms, a linear or branched alkenyl group having from 2 to 20 carbon atoms, a linear or branched alkenyloxy group having from 2 to 20 carbon atoms, a hydroxyl group, a halogen atom, a nitro group, a cyano group, a trihalomethyl group, a phenyl group, a substituted phenyl group or a —$B^1$—$SO_3^-M^+$ group, $B^1$ represents —$(CH_2)_p$—$(O)_q$—$(CH_2)_r$—, p and r each independently represents 0 or an integer of 1 to 3, q represents 0 or 1, and $M^+$ represents a hydrogen ion, an alkali metal ion or a quaternary ammonium ion.

The crosslinked structure represented by formula (2) can be produced by dehydration-condensing self-doping type electrically conducting polymers having a structure represented by formula (7) and/or formula (8):

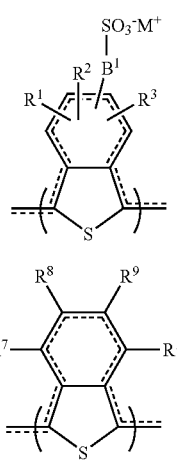

(7)

(8)

In formulae (7) and (8), $R^1$ to $R^3$ and $R^7$ to $R^{10}$ each independently represents a hydrogen atom, a linear or branched alkyl group having from 1 to 20 carbon atoms, a linear or branched alkoxy group having from 1 to 20 carbon atoms, a linear or branched alkenyl group having from 2 to 20 carbon atoms, a linear or branched alkenyloxy group having from 2 to 20 carbon atoms, a hydroxyl group, a halogen atom, a nitro group, a cyano group, a trihalomethyl group, a phenyl group, a substituted phenyl group or a —$B^1$—$SO_3^-M^+$ group, with the proviso that at least one of $R^7$ to $R^{10}$ is a hydrogen atom, $B^1$ represents —$(CH_2)_p$—$(O)_q$—$(CH_2)_r$—, p and r each independently represents 0 or an integer of 1 to 3, q represents 0 or 1, and $M^+$ represents a hydrogen ion, an alkali metal ion or a quaternary ammonium ion.

Preferred examples of $R^1$ to $R^{10}$ include a hydrogen atom, an alkyl group, an alkoxy group, an alkenyl group, an alkenyloxy group, a phenyl or substituted phenyl group, and a sulfonic acid group. Specific examples of the alkyl group include methyl, ethyl, propyl, isopropyl, butyl, pentyl, hexyl, heptyl, octyl, nonyl, decyl, undecyl, dodecyl, tetradecyl, hexadecyl, ethoxyethyl, methoxyethyl, methoxyethoxyethyl, acetonyl and phenacyl; specific examples of the alkenyl group include ally and 1-butenyl; specific examples of the alkoxy group include methoxy, ethoxy, propoxy, isopropoxy, butoxy, pentyloxy, hexyloxy, octyloxy and dodecyloxy; and specific examples of the substituted phenyl group include a fluorophenyl group, a chlorophenyl group, a bromophenyl group, a methylphenyl group and a methoxyphenyl group.

These alkyl group, alkoxy group, alkenyl group and alkenyloxy group each may contain in its chain a carbonyl bond, an ether bond, an ester bond, a sulfonic acid ester bond, an amide bond, a sulfonamide bond, a sulfide bond, a sulfinyl bond, a sulfonyl bond or an imino bond. Specific examples of the alkyl ester group include an alkoxycarbonyl group such as methoxycarbonyl, ethoxycarbonyl and butoxycarbonyl, an acyloxy group such as acetoxy and butyroyloxy, a methoxyethoxy group, and a methoxyethoxyethoxy group.

$M^+$ represents a hydrogen ion, an alkali metal ion such as $Na^+$, $Li^+$ and $K^+$, or a quaternary ammonium cation represented by $N(R^{11})(R^{12})(R^{13})(R^{14})^+$, and $M^+$ may be a mixture containing one or more members of these cations.

In the above, $R^{11}$ to $R^{14}$ each independently represents a hydrogen atom, a linear or branched, substituted or unsubstituted alkyl group having from 1 to 30 carbon atoms, or a substituted or unsubstituted aryl group, and may be an alkyl or aryl group having a group containing elements other than carbon and hydrogen, such as alkoxy group, hydroxyl group, oxyalkylene group, thioalkylene group, azo group, azobenzene group and p-diphenyleneoxy group.

Examples of the quaternary ammonium cation include $NH_4^+$, $NH(CH_3)_3^+$, $NH(C_6H_5)_3^+$ and $N(CH_3)_2(CH_2OH)(CH_2\text{-}Z)^+$ (wherein Z represents an arbitrary substitutent having a chemical formula weight of 600 or less, for example, a substitutent such as phenoxy group, p-diphenyleneoxy group, p-alkoxydiphenyleneoxy group and p-alkoxyphenylazophenoxy group). In order to effect conversion into a specific cation, a normal ion exchange resin may be used.

In formulae (1) to (11), $B^1$ and $B^2$ each represents —$(CH_2)_p$—$(O)_q$—$(CH_2)_r$—, p and r each independently represents 0 or an integer of 1 to 3, and q represents 0 or 1. When p=r=0, B represents a single bond and —$B^1$—$SO_3^-M^+$ becomes —$SO_3^-M^+$ and allows for direct bonding of the sulfur atom to the objective bonding site.

Preferred examples of $B^1$ and $B^2$ include single bond, methylene, ethylene, propylene, butylene, pentylene, hexylene, arylene, butadienylene, oxymethylene, oxyethylene, oxypropylene, methyleneoxyethylene and ethyleneoxyethylene.

Among these examples of $B^1$ and $B^2$ represented by $-(CH_2)_p-(O)_q-(CH_2)_r-$, still more preferred are single bond, ethylene, propylene, oxyethylene and ethyleneoxyethylene.

Out of the components constituting the self-doping type electrically conducting polymer in a preferred embodiment of the present invention, the crosslinked structure moiety represented by formula (1) is preferably contained in a proportion of 1 to 90 mol %, more preferably from 20 to 80 mol %, based on the repeating unit of the polymer. If the proportion is less than 1 mol %, the water resistance tends to decrease, whereas if it exceeds 90 mol %, the electrical conductivity tends to decrease.

The self-doping type electrically conducting polymer according to the present invention may have a polypyrrole structure, a polythiophene structure, a polycarbazole structure, a polyaniline structure, an arylenevinylene structure or the like.

Out of the components constituting the self-doping type electrically conducting polymer in a preferred embodiment of the present invention, the portion except for the crosslinked structure moiety represented by formula (1) is not particularly limited as far as the electrical conductivity is not impaired, it is preferable that an isothianaphthene skeleton be included. That is, the self-doping type electrically conducting polymer is preferably a (co)polymer comprising a constituent component having a structure represented by formula (7) and/or a constituent component having a structure represented by formula (8). It is more preferable that the self-doping type electrically conducting polymer partially contain a structure represented by formula (7):

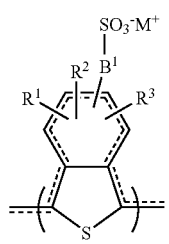

(7)

(wherein $R^1$ to $R^3$ and $B^1$ are as defined above). In this case, in order to effect dehydration condensation with a sulfonic acid group to form crosslinking through a sulfone bond, at least one of $R^1$ to $R^3$ must be a hydrogen atom. A structure resulting from (co)polymerization of the monomer of formula (9) is more preferred and when these polymers are dehydration-condensed and crosslinked, this crosslinking gives a crosslinked structure through a sulfone bond represented by formula (3). Furthermore, a structure where the structure of $B^1$ is not present and the sulfur atom is directly bonded to the benzene ring is more preferred.

The self-doping type electrically conducting polymer having an isothianaphthene skeleton of formula (7) and/or formula (8) of the present invention is a water-soluble electrically conducting polymer where a sulfonic acid group is covalently bonded directly or through a side chain of the molecule.

Specific examples of the polymer containing an isothianaphthene structure include poly(isothianaphthene sulfonic acid), various salt structures and substitution derivatives thereof, (co)polymers containing a repeating unit such as poly(isothianaphthene sulfonic acid-co-isothianaphthene), and various salt structures and substitution derivatives thereof.

More specifically, the crosslinked self-doping type electrically conducting polymer of the present invention preferably contains a structure crosslinked through a sulfone bond, represented by formula (4):

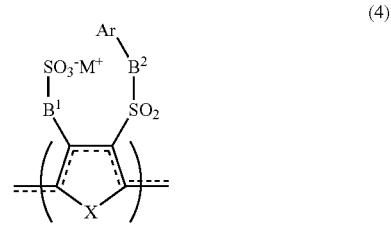

(4)

In formula (4), X represents $-S-$, $-O-$ or $-N(-R^{15})-$, $R^{15}$ each independently represents a hydrogen atom, a linear or branched alkyl group having from 1 to 20 carbon atoms, or a linear or branched alkenyl group having from 2 to 20 carbon atoms, $B^1$ and $B^2$ each represents $-(CH_2)_p-(O)_q-(CH_2)_r-$, p and r each independently represents 0 or an integer of 1 to 3, q represents 0 or 1.

Further, Ar in formula (4) represents a monovalent aromatic group, a substituted monovalent aromatic group, a monovalent heterocyclic group or a substituted monovalent heterocyclic group. More specifically, preferred examples thereof include phenyl group, substituted phenyl group, naphthyl group, substituted naphthyl group, anthranyl group, substituted anthranyl group, quinolyl group, substituted quinolyl group, quinoxalyl group, substituted quinoxalyl group, thienyl group, substituted thienyl group, pyrrolyl group, substituted pyrrolyl group, furanyl group, substituted furanyl group, isothianaphthenylene group, substituted isothianaphthenylene group, carbazolyl group and substituted carbazolyl group. Particularly preferred are phenyl group, substituted phenyl group, naphthyl group, substituted naphthyl group, quinoxalyl group, substituted quinoxalyl group, thienyl group, substituted thienyl group, pyrrolyl group, substituted pyrrolyl group, isothianaphthenylene group and substituted isothianaphthenylene group.

More preferably, the polymer may be a polymer containing a structure crosslinked through a sulfone bond as represented by formula (5):

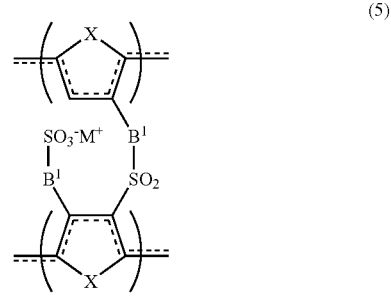

(5)

In formula (5), X represents $-S-$, $-O-$ or $-N(-R^{15})-$, $R^{15}$ each independently represents a hydrogen atom, a linear or branched alkyl group having from 1 to 20 carbon atoms, or a linear or branched alkenyl group having from 2 to 20 carbon atoms, $B^1$ represents $-(CH_2)_p-(O)_q-(CH_2)_r-$, p and r each independently represents 0 or an integer of 1 to 3, q represents 0 or 1, and M⁺ represents a hydrogen ion, an alkali metal ion or a quaternary ammonium ion.

Specific examples of the particularly preferred alkyl group represented by $R^{15}$ include methyl, ethyl, propyl, isopropyl, butyl, pentyl, hexyl, heptyl, octyl, nonyl, decyl, undecyl, dodecyl, tetradecyl, hexadecyl, ethoxyethyl, methoxyethyl, methoxyethoxyethyl, acetonyl and phenacyl. Specific examples of the alkenyl group include allyl and 1-butenyl.

The crosslinked structure represented by formula (6) can be produced by dehydration-condensing self-doping type electrically conducting polymers having a structure represented by formula (10):

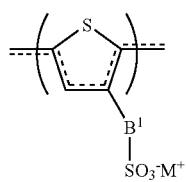

(10)

(wherein $B^1$, p, q and r contained in $B^1$, and M⁺ are the same as defined above).

The proportion of the repeating unit of the chemical structure containing a sulfonic acid group in the above-described (co)polymer is usually from 50 to 100 mol %, preferably from 80 to 100 mol %, based on all repeating units of the (co) polymer. The (co)polymer may contain a repeating unit comprising another π conjugated chemical structure or may be a (co)polymer composition comprising from 2 to 5 kinds of repeating units.

The "(co)polymer containing a repeating unit" as used in the present invention is not limited to a (co)polymer containing such a unit in a continuous manner but also means a (co)polymer which can contain a repeating unit irregularly or discontinuously in the π conjugated main chain like a random copolymer as long as the desired electrical conductivity based on the π conjugated main chain is expressed.

Specific preferred examples of the chemical structure represented by formula (7) include 5-sulfoisothianaphthene-1,3-diyl, 4-sulfoisothianaphthene-1,3-diyl, 4-methyl-5-sulfoisothianaphthene-1,3-diyl, 6-methyl-5-sulfoisothianaphthene-1,3-diyl, 6-methyl-4-sulfoisothianaphthene-1,3-diyl, 5-methyl-4-sulfoisothianaphthene-1,3-diyl, 6-ethyl-5-sulfoisothianaphthene-1,3-diyl, 6-propyl-5-sulfoisothianaphthene-1,3-diyl, 6-butyl-5-sulfoisothianaphthene-1,3-diyl, 6-hexyl-5-sulfoisothianaphthene-1,3-diyl, 6-decyl-5-sulfoisothianaphthene-1,3-diyl, 6-methoxy-5-sulfoisothianaphthene-1,3-diyl, 6-ethoxy-5-sulfoisothianaphthene-1,3-diyl, 6-chloro-5-sulfoisothianaphthene-1,3-diyl, 6-bromo-5-sulfoisothianaphthene-1,3-diyl, 6-trifluoromethyl-5-sulfoisothianaphthene-1,3-diyl, 5-(sulfomethane) isothianaphthene-1,3-diyl, 5-(2'-sulfoethane)isothianaphthene-1,3-diyl, 5-(2'-sulfoethoxy)isothianaphthene-1,3-diyl, 5-(2'-(2''-sulfoethoxy)methane)isothianaphthene-1,3-diyl, 5-(2'-(2''-sulfoethoxy)ethane)isothianaphthene-1,3-diyl, and their lithium salt, sodium salt, ammonium salt, methylammonium salt, ethylammonium salt, dimethylammonium salt, diethylammonium salt, trimethylammonium salt, triethylammonium salt, tetramethylammonium salt and tetraethylammonium salt.

Specific preferred examples of the chemical structure represented by formula (8) include 5-sulfoisothianaphthene-1,3-diyl, 4-sulfoisothianaphthene-1,3-diyl, 4-methyl-5-sulfoisothianaphthene-1,3-diyl, 6-methyl-5-sulfoisothianaphthene-1,3-diyl, 6-methyl-4-sulfoisothianaphthene-1,3-diyl, 5-methyl-4-sulfoisothianaphthene-1,3-diyl, 6-ethyl-5-sulfoisothianaphthene-1,3-diyl, 6-propyl-5-sulfoisothianaphthene-1,3-diyl, 6-butyl-5-sulfoisothianaphthene-1,3-diyl, 6-hexyl-5-sulfoisothianaphthene-1,3-diyl, 6-decyl-5-sulfoisothianaphthene-1,3-diyl, 6-methoxy-5-sulfoisothianaphthene-1,3-diyl, 6-ethoxy-5-sulfoisothianaphthene-1,3-diyl, 6-chloro-5-sulfoisothianaphthene-1,3-diyl, 6-bromo-5-sulfoisothianaphthene-1,3-diyl, 6-trifluoromethyl-5-sulfoisothianaphthene-1,3-diyl, 5-(sulfomethane) isothianaphthene-1,3-diyl, 5-(2'-sulfoethane)isothianaphthene-1,3-diyl, 5-(2'-sulfoethoxy)isothianaphthene-1,3-diyl, 5-(2'-(2''-sulfoethoxy)methane)isothianaphthene-1,3-diyl, 5-(2'-(2''-sulfoethoxy)ethane)isothianaphthene-1,3-diyl, their lithium salt, sodium salt, ammonium salt, methylammonium salt, ethylammonium salt, dimethylammonium salt, diethylammonium salt, trimethylammonium salt, triethylammonium salt, tetramethylammonium salt and tetraethylammonium salt, isothianaphthene-1,3-diyl, 4-methyl-isothianaphthene-1,3-diyl, 5-methyl-isothianaphthene-1,3-diyl, 4,5-dimethyl-isothianaphthene-1,3-diyl, 5,6-dimethyl-isothianaphthene-1,3-diyl, 4,5-dimethoxy-isothianaphthene-1,3-diyl, 5,6-dimethoxy-isothianaphthene-1,3-diyl, 4-ethyl-isothianaphthene-1,3-diyl, 5-ethyl-isothianaphthene-1,3-diyl, 4,5-diethyl-isothianaphthene-1,3-diyl, 5,6-diethyl-isothianaphthene-1,3-diyl, 4,5-diethoxy-isothianaphthene-1,3-diyl, 5,6-diethoxy-isothianaphthene-1,3-diyl, 4-propyl-isothianaphthene-1,3-diyl, 5-propyl-isothianaphthene-1,3-diyl, 4,5-dipropyl-isothianaphthene-1,3-diyl, 5,6-dipropyl-isothianaphthene-1,3-diyl, 4-propoxy-isothianaphthene-1,3-diyl, 5-propoxy-isothianaphthene-1,3-diyl, 5-butyl-isothianaphthene-1,3-diyl, 5-hexyl-isothianaphthene-1,3-diyl, 5-decyl-isothianaphthene-1,3-diyl, 5-methoxy-isothianaphthene-1,3-diyl, 5-ethoxy-isothianaphthene-1,3-diyl, 5-chloro-isothianaphthene-1,3-diyl, 5-bromo-isothianaphthene-1,3-diyl and 5-trifluoromethyl-isothianaphthene-1,3-diyl.

Specific preferred examples of the chemical structure represented by formula (9) include 1,3-dihydroisothia-naphthene-5-sulfonic acid, 1,3-dihydroisothianaphthene-4-sulfonic acid, 4-methyl-1,3-dihydroisothianaphthene-5-sulfonic acid, 4-methyl-1,3-dihydroisothianaphthene-5-sulfonic acid, 6-methyl-1,3-dihydroisothianaphthene-5-sulfonic acid, 5-methyl-1,3-dihydroisothianaphthene-4-sulfonic acid, 6-methyl-1,3-dihydroisothianaphthene-4-sulfonic acid, 6-ethyl-1,3-dihydroisothianaphthene-5-sulfonic acid, 6-propyl-1,3-dihydroisothianaphthene-5-sulfonic acid, 6-butyl-1,3-dihydroisothianaphthene-5-sulfonic acid, 6-hexyl-1,3-dihydroisothianaphthene-5-sulfonic acid, 6-decyl-1,3-dihydroisothianaphthene-5-sulfonic acid, 6-methoxy-1,3-dihydroisothianaphthene-5-sulfonic acid, 6-ethoxy-1,3-dihydroisothianaphthene-5-sulfonic acid, 6-chloro-1,3-dihydroisothianaphthene-5-sulfonic acid, 6-bromo-1,3-dihydroisothianaphthene-5-sulfonic acid, 6-trifluoromethyl-1,3-dihydroisothianaphthene-5-sulfonic acid, 1,3-dihydroisothianaphthene-5-methanesulfonic acid, (1',3'-dihydro-5'-isothianaphthenyl)methanesulfonic acid, 2-(1',3'- dihydro-5'-isothianaphthenyl)ethanesulfonic acid, (2-(1',3'-dihydro-5'-isothianaphthenyl)ethyloxy)methanesulfonic acid, and their lithium salt, sodium salt, ammonium salt, methylammonium salt, ethylammonium salt, dimethylammonium salt, diethylammonium salt, trimethylammonium salt, triethylammonium salt, tetramethylammonium salt and tetraethylammonium salt.

Specific preferred examples of the chemical structure represented by formula (10) include 3-sulfothiophene-2,5-diyl, 3-sulfomethylthiophene-2,5-diyl, 3-(2'-sulfoethyl)thiophene-2,5-diyl, 3-(3'-sulfopropyl)thiophene-2,5-diyl, 3-(4'-sulfobutyl)thiophene-2,5-diyl, 3-(5'-sulfopentyl)thiophene-2,5-diyl, 3-(6'-sulfohexyl)thiophene-2,5-diyl, 3-(7'-sulfoheptyl)thiophene-2,5-diyl, 3-(8'-sulfooctyl)thiophene-2,5-diyl, 3-(9'-sulfononyl)thiophene-2,5-diyl, 3-(10'-sulfodecyl)thiophene-2,5-diyl, 3-(2'-sulfoethyloxy)thiophene-2,5-diyl, 3-(3'-sulfopropoxy)thiophene-2,5-diyl, 3-(4'-sulfobutoxy)thiophene-2,5-diyl, 3-(5'-sulfopentyloxy)thiophene-2,5-diyl, 3-(6'-sulfohexyloxy)thiophene-2,5-diyl, 3-(7'-sulfoheptyloxy)thiophene-2,5-diyl, 3-(8'-sulfooctyloxy)thiophene-2,5-diyl, 3-(9'-sulfononyloxy)thiophene-2,5-diyl, 3-(10'-sulfodecyloxy)thiophene-2,5-diyl, 3-sulfopyrrole-2,5-diyl, 3-sulfomethylpyrrole-2,5-diyl, 3-(2'-sulfoethyl)pyrrole-2,5-diyl, 3-(3'-sulfopropyl)pyrrole-2,5-diyl, 3-(4'-sulfobutyl)pyrrole-2,5-diyl, 3-(5'-sulfopentyl)pyrrole-2,5-diyl, 3-(6'-sulfohexyl)pyrrole-2,5-diyl, 3-(7'-sulfoheptyl)pyrrole-2,5-diyl, 3-(8'-sulfooctyl)pyrrole-2,5-diyl, 3-(9'-sulfononyl)pyrrole-2,5-diyl, 3-(10'-sulfodecyl)pyrrole-2,5-diyl, and their lithium salt, sodium salt, ammonium salt, methylammonium salt, ethylammonium salt, dimethylammonium salt, diethylammonium salt, trimethylammonium salt, triethylammonium salt, tetramethylammonium salt and tetraethylammonium salt.

Specific preferred examples of the chemical structure represented by formula (11) include 3-thienylsulfonic acid, 3-thienylmethanesulfonic acid, 2-(3'-thienyl)ethanesulfonic acid, 3-(3'-thienyl)propanesulfonic acid, 4-(3'-thienyl)-butanesulfonic acid, 5-(3'-thienyl)pentanesulfonic acid, 6-(3'-thienyl)hexanesulfonic acid, 7-(3'-thienyl)heptane-sulfonic acid, 8-(3'-thienyl)octanesulfonic acid, 9-(3'-thienyl)nonanesulfonic acid, 10-(3'-thienyl)decanesulfonic acid, 2-(3'-thienyl)oxyethanesulfonic acid, 3-(3'-thienyl)oxypropanesulfonic acid, 4-(3'-thienyl)oxybutane-sulfonic acid, 5-(3'-thienyl)oxypentanesulfonic acid, 6-(3'-thienyl)oxyhexanesulfonic acid, 7-(3'-thienyl)oxyheptanesulfonic acid, 8-(3'-thienyl)oxyoctanesulfonic acid, 9-(3'-thienyl)oxynonanesulfonic acid, 10-(3'-thienyl)-oxydecanesulfonic acid, and their lithium salt, sodium salt, ammonium salt, methylammonium salt, ethylammonium salt, dimethylammonium salt, diethylammonium salt, trimethyl-ammonium salt, triethylammonium salt, tetramethylammonium salt and tetraethylammonium salt.

Also, specific examples of the crosslinked structure other than formulae (1) to (6) include poly(carbazole-N-alkanesulfonic acid), poly(phenylene-oxyalkanesulfonic acid), poly(phenylenevinylene-alkanesulfonic acid), poly(thienylenevinylene-alkanesulfonic acid), poly(thienylenevinylene-oxyalkanesulfonic acid), poly(anilinethioalkanesulfonic acid), poly(aniline-N-alkanesulfonic acid), their substitution derivatives, and a structure where self-doping type electrically conducting polymers denoted as 6-sulfonaphtho[2,3-c]thiophene-1,3-diyl are crosslinked through a sulfone bond.

The molecular weight of the self-doping type electrically conducting polymer having an isothianaphthene or thiophene skeleton for use in the production of the crosslinked self-doping type electrically conducting polymer in a preferred embodiment of the present invention varies depending on the chemical structure of the constituent repeating unit and cannot be unconditionally-specified. The molecular weight is not particularly limited and may be sufficient if it is suited for the purpose of the present invention. When the molecular weight is expressed by the number of repeating units constituting the main chain (polymerization degree), the polymerization degree is usually from 5 to 2,000, preferably from 10 to 1,000.

Particularly preferred specific examples of the self-doping type electrically conducting polymer containing an isothianaphthene skeleton having a chemical structure represented by formula (7) and/or formula (8), which is used for the production of the self-doping type electrically conducting polymer represented by formula (2) or (3) of the present invention, include:

i) a polymer of 5-sulfoisothianaphthene-1,3-diyl which is one example of the chemical structure represented by formula (7), and/or its lithium salt, sodium salt, ammonium salt and triethylammonium salt, and ii) a random copolymer containing 80 mol % or more of 5-sulfoisothianaphthene-1,3-diyl which is one example of the chemical structure represented by formula (7), poly(5-sulfoisothianaphthene-1,3-diyl-co-isothianaphthene-1,3-diyl) and/or their lithium salt, sodium salt, ammonium salt, and triethylammonium salt.

Particularly preferred specific examples of the self-doping type electrically conducting polymer containing a thiophene skeleton having a chemical structure represented by formula (10), which is used for the production of the self-doping type electrically conducting polymer represented by formula (5) or (6) of the present invention, include:

i) a polymer of 3-(2'-sulfoethyl)thiophene-2,5-diyl which is one example of the chemical structure represented by formula (10), and/or its lithium salt, sodium salt, ammonium salt, and triethylammonium salt, and ii) a polymer of 3-(3'-sulfopropyl)thiophene-2,5-diyl which is one example of the chemical structure represented by formula (10), and/or its lithium salt, sodium salt, ammonium salt, and triethylammonium salt The crosslinked self-doping type electrically conducting polymer having an isothianaphthene skeleton represented by formula (2) or (3) of the present invention is produced by causing the self-doping type electrically conducting polymers represented by formula (7) and/or formula (8) to undergo a dehydration condensation reaction of the sulfonic acid between molecules or between molecular chains.

The crosslinked self-doping type electrically conducting polymer having a thiophene skeleton represented by formula (5) or (6) of the present invention is produced by causing the self-doping type electrically conducting polymers represented by formula (10) to undergo a dehydration condensation reaction of the sulfonic acid between molecules or between molecular chains.

When the self-doping type electrically conducting polymers represented by formula (7) and/or formula (8) or formula (10) of the present invention are heat-treated, the resulting electrically conducting polymer contains a sulfone bond, that is, the polymer contains an isothianaphthene skeletons crosslinked through a sulfone bond as shown in formula (2) or (3) or a thiophene skeleton as shown in formula (5) or (6). This is confirmed by X-ray photoelectron spectrometry (hereinafter simply referred to as "XPS") analysis on the coating film formed on a substrate where a peak attributable to the sulfone bond is newly produced in addition to the peak based on the binding energy of S2p-spin 3/2 of the sulfur atom constituting the thiophene ring and the peak based on the binding energy of S2p-spin 3/2 of the sulfur atom constituting the sulfonic acid group.

The binding energy of sulfur atom originated in the sulfone bond is present in between the binding energy of sulfur atom constituting the thiophene ring and the binding energy of sulfur atom constituting the sulfonic acid group. More specifically, the peak thereof is located at a position from 0.5 to 2 eV lower than the binding energy of S2p-spin 3/2 of sulfur atom constituting the sulfonic acid group. When the difference between the binding energy of sulfur atom originated in the sulfone bond and the binding energy of sulfur atom constituting the sulfonic acid group is from 0.5 to 1 eV, the peaks of these binding energies are integrated and appear as a peak having a wide half-value width, and the peaks can be separated by peak fitting.

The crosslinked self-doping type electrically conducting polymer of the present invention is preferably an electrical conductor or electrically conducting composition where a peak attributable to the sulfone bond is detected by XPS analysis, more preferably an electrical conductor or electrically conducting composition where the intensity ratio (intensity ratio=peak intensity based on the presence of sulfone bond/peak intensity based on the presence of sulfur atom constituting sulfonic acid) is from 0.1 to 10. The intensity ratio is particularly preferably from 0.5 to 10.

The self-doping type electrically conducting polymer having a crosslinked structure represented by formula (2) of the present invention is preferably obtained by heating self-doping type electrically conducting polymers having a structure represented by formula (7) and/or formula (8). In particular, it is preferable that the self-doping type electrically conducting polymer be produced by coating an electrically conducting composition containing a self-doping type electrically conducting polymer having a structure represented by formula (7) and/or formula (8) on a surface of a substrate to provide a film state, and heat-treating the substrate at a temperature of from 210 to 350° C. for 1 second to 10 minutes. The heating temperature is preferably 250 to 300° C. and the heating time is preferably from 10 seconds to 5 minutes, more preferably from 30 seconds to 5 minutes. If the heating temperature is less than 210° C., even when the heating time is prolonged to 15 minutes, the solvent resistance, particularly, water resistance can be hardly obtained, whereas if it exceeds 350° C., the electrical conductivity tends to decrease in a practical heating time. If the heating time is too short, the solvent resistance is liable to decrease, whereas if it is too long, the electrical conductivity decreases.

The self-doping type electrically conducting polymer having a crosslinked structure represented by formula (6) of the present invention is preferably obtained by heating self-doping type electrically conducting polymer having a structure represented by formula (10). Particularly, it is preferable that the self-doping type electrically conducting polymer be produced by coating an electrically conducting composition containing a self-doping type electrically conducting polymer having a structure represented by formula (10) on a surface of a substrate to provide a film state, and heat-treating the substrate at a temperature of 120 to 250° C. for 1 second to 10 minutes. The heating temperature is preferably 150 to 200° C. and the heating time is preferably from 10 seconds to 5 minutes, more preferably from 30 seconds to 5 minutes. If the heating temperature is less than 120° C., even when the heating time is prolonged to 15 minutes, the solvent resistance or the like tends to decrease, whereas if it exceeds 250° C., the electrical conductivity decreases in a practical heating time. If the heating time is too short, the solvent resistance is liable to decrease, whereas if it is too long, the electrical conductivity decreases.

According to the preferred process of the present invention, deterioration due to oxygen or oxidation is not incurred even when the heat treatment is performed in air. Thus, the heat treatment can be performed even in air without any problem. Formation of a sulfone bond by heating, which takes place in dehydration condensation reaction, is fundamentally free from influence from the atmosphere and therefore, the reaction can be performed also in an inert gas atmosphere.

Examples of heat-treatment method for obtaining the self-doping type electrically conducting polymer having a crosslinked structure include a method of coating a non-crosslinked self-doping type electrically conducting polymer having a structure of formula (7), (8) or (10) on a substrate and then heating it by a hot plate or heating the entire substrate in an oven. Use of a hot plate, which has good thermal conductivity and assures efficient heating, is most preferred.

Examples of the substrate used for producing the self-doping type electrically conducting polymer having an isothianaphthene skeleton represented by formula (2) or the self-doping type electrically conducting polymer having a thiophene skeleton represented by formula (5) of the present invention include low soda glasses such as quartz glass and barium borosilicate glass, metals such as stainless steel, copper and iron, and compound semiconductor wafers such as silicon wafer, gallium-arsenic, indium-phosphorus, gallium nitride and SiC. By using a substrate having high thermal conductivity, the self-doping type electrically conducting polymer having an isothianaphthene skeleton represented by formula (2) or the self-doping type electrically conducting polymer having a thiophene skeleton represented by formula (5) can be efficiently produced.

In particular, when the crosslinked self-doping type electrically conducting polymer of the present invention is coated on the front or back surface or over the entire surface of a silicon wafer or compound semiconductor wafer, unexpected charge accumulated not only in the insulating compound semiconductor wafer but also in the silicon wafer which is a semiconductor, can be removed. Therefore, the present invention is useful to enhance accuracy of wafer inspection using a scanning electron microscope. The crosslinked self-doping type electrically conducting polymer of the present invention has excellent mechanical strength and therefore, even when a wafer having coated on the back surface the electrically conducting polymer is mechanically transported, the coated wafer is not damaged and therefore the electrical conductivity is not deteriorated. Furthermore, since generation of dusts is suppressed, the throughput of wafer inspection can be elevated.

On the other hand, the self-doping type electrically conducting polymer having a thiophene skeleton represented by formula (5) becomes a sulfone-crosslinked body at a relatively low temperature and therefore, when this polymer is applied on the surface of a polymer film, a polymer fiber, a polymer substrate or a polymer resin shaped body and is heat-treated, an antistatic film can be easily formed.

The crosslinked self-doping type electrically conducting polymer of the present invention is most efficiently produced on a substrate surface but may also be produced by coating the polymer on a surface of a shaped body and heating it on a hot plate or in an oven, so that a useful electrically conducting coated product such as sensor and electrode can be produced.

The self-doping type electrically conducting polymer having an isothianaphthene skeleton represented by formula (2) exhibits very high heat resistance even when it is formed as a thin film. That is, when the self-doping type electrically conducting polymer having an isothianaphthene skeleton represented by formula (2) is formed into a film, the film thickness thereof is preferably from 1 to 1,000 nm, but in the case of using it as a thin film also having transparency, the film thickness is more preferably from 1 to 100 nm. In general, if a thin film is heat-treated at a high temperature in air, deterioration due to oxygen and oxidation readily proceeds, but in the case of a thin film formed of the self-doping type electrically conducting polymer having an isothianaphthene skeleton represented by formula (2), even when the film thickness is from 1 to 100 nm, serious reduction in the electrical conductivity does not occur at the heat-treatment in the production process of the present invention.

The surface resistance value of the self-doping type electrically conducting polymer having an isothianaphthene skeleton represented by formula (2) varies depending on the kind of composition, film thickness, heating method, heating temperature, heating time, kind of substrate and the like and therefore, cannot be unconditionally specified, but is preferably from $1 \times 10^3$ to $5 \times 10^9$ Ω/square, more preferably from $1 \times 10^4$ to $5 \times 10^8$ Ω/square, still more preferably from $1 \times 10^4$ to $5 \times 10^7$ Ω/square. The surface resistance value after heat treatment of the substrate coated with the electrically conducting polymer having a structure represented by formula (5) and/or formula (6) varies depending on the kind of composition, film thickness, heating method, heating temperature, heating time, kind of substrate and the like and therefore, cannot be unconditionally specified, but is preferably from $1/10$ to 1,000 times, more preferably from $1/10$ to 100 times, the surface resistance value at the initial stage (before heating).

The self-doping type electrically conducting polymer having a thiophene skeleton represented by formula (5) can be easily formed even by heating at a low temperature and therefore, this polymer is effective particularly for organic devices where deterioration is caused by the presence of water in the thin film. The film thickness of the self-doping type electrically conducting polymer having a thiophene skeleton represented by formula (5) is preferably from 1 to 1,000 nm, but in the case of using it as a thin film also having transparency, the film thickness is more preferably from 1 to 100 nm.

The surface resistance value of the self-doping type electrically conducting polymer having a thiophene skeleton represented by formula (5) varies depending on the kind of composition, film thickness, heating method, heating temperature, heating time, kind of substrate and the like and therefore, cannot be unconditionally specified, but is preferably from $1 \times 10^3$ to $5 \times 10^9$ Ω/square, more preferably from $1 \times 10^4$ to $5 \times 10^8$ Ω/square. The surface resistance value after heat treatment of the substrate coated with the electrically conducting polymer having a structure represented by formula (5) varies depending on the kind of composition, film thickness, heating method, heating temperature, heating time, kind of substrate and the like and therefore, cannot be unconditionally specified, but is preferably from $1/10$ to 1,000 times, more preferably from $1/10$ to 100 times, the surface resistance value at the initial stage (before heating).

The self-doping type electrically conducting polymer having an isothianaphthene skeleton represented by formula (2) and the self-doping type electrically conducting polymer having a thiophene skeleton represented by formula (5) are usually used individually, but when high electrical conductivity is required or in order to obtain solvent resistance by effecting the sulfone-crosslinking at a heating temperature of 200° C. or less, non-crosslinked self-doping type electrically conducting polymers having a structure of formula (7), (8) or (10) may be mixed and heated, whereby a self-doping type electrically conducting polymer comprising formulae of formula (7) and/or (8) or formula (10) which are sulfone-crosslinked with each other can be obtained. In producing a self-doping type electrically conducting polymer where two or more kinds of the self-doping type electrically conducting polymers are crosslinked, the preferred heating temperature varies depending on the structure and compositional ratio of each self-doping type electrically conducting polymer and cannot be unconditionally specified, but is preferably from 150 to 300° C., more preferably from 200 to 250° C.

Examples of the electronic device using the heat-resistant crosslinked self-doping type electrically conducting polymer of the present invention include an electronic device where the heat-resistant crosslinked self-doping type electrically conducting polymer of the present invention is disposed between electrodes. Between electrodes, materials other than the heat-resistant crosslinked self-doping type electrically conducting polymer of the present invention may be contained, or a stacked structure consisting of a thin film formed of the heat-resistant crosslinked self-doping type electrically conducting polymer and other thin films formed of other materials may be formed. As for the electronic device, a more specific example is an organic light-emitting element.

The organic light-emitting element in a preferred embodiment of the present invention is specifically described below by referring to the drawings.

Figure 7:
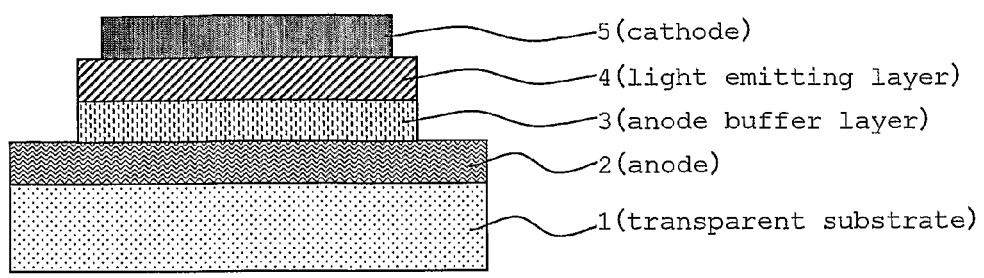
FIG. 7 shows a cross-sectional view showing an example of the organic light-emitting element of the present invention.

FIG. 7 is a cross-sectional view showing one example of the construction for the organic light-emitting element of the present invention, where an anode buffer layer (3) and a light-emitting layer (4) are sequentially stacked between an anode (2) and a cathode (5) provided on a transparent substrate (1). The construction of the organic light-emitting element of the present invention is not limited to the case shown in FIG. 7, but examples thereof include element constructions where one structure of 1) anode buffer layer/hole transport layer/light-emitting layer, 2) anode buffer layer/light-emitting layer/electron transport layer, 3) anode buffer layer/hole transport layer/light-emitting layer/electron transport layer, 4) anode buffer layer/layer containing hole transport material, light-emitting material and electron transport material, 5) anode buffer layer/layer containing hole transport material and light-emitting material and 6) anode buffer layer/layer containing light-emitting layer and electron transport material, is provided in this order between an anode and a cathode. Moreover, in FIG. 7, one light-emitting layer is provided, but the element may have two or more light-emitting layers.

The anode buffer layer in the organic light-emitting element of the present invention can be formed, for example, by coating a solution for the self-doping type electrically conducting polymer having an isothianaphthene or thiophene skeleton on a substrate having formed thereon anode, and then heat-treating it. As for the coating method, a spin coating method, an inkjet method, a printing method, a spray method, a dispenser method or the like can be used. The thickness of the anode buffer layer is preferably from 10 to 200 nm, more preferably from 20 to 100 nm.

The molecular weight of the self-doping type polymer for use in the present invention is, in terms of the weight average molecular weight, preferably from 1,000 to 200,000, more preferably from 5,000 to 100,000.

As for compounds used for the light-emitting layer, hole transport layer and electron transport layer in the organic light-emitting element of the present invention, either a low molecular compound or a polymer compound can be used. Since the anode buffer layer of the present invention is a polymer compound, a polymer compound is preferred from the standpoint of simplifying the element production process.

Examples of the light-emitting material constituting the light-emitting layer of the organic light-emitting element of the present invention include low molecular light-emitting materials and polymer light-emitting materials described in Hiroshi Omori, Oyo Butsuri (Applied Physics), Vol. 70, No. 12, pp. 1419-1425 (2001). Among these, phosphorescent materials are preferred in view of high light emission efficiency. Also, polymer light-emitting materials are preferred because the element production process is simplified. Accordingly, phosphorescence-emitting polymer compounds are more preferred.

The phosphorescence-emitting polymer compound used as the light-emitting layer of the organic light-emitting element of the present invention is not particularly limited in its structure as long as it is a polymer compound emitting phosphorescence at room temperature. Specific examples of the polymer structure include polymer structures comprising a conjugated polymer skeleton such as poly(p-phenylenes), poly(p-phenylenevinylenes), polyfluorenes, polythiophenes, polyanilines, polypyrroles and polypyridines to which a phosphorescent moiety (representative examples thereof include monovalent or divalent groups of transition metal complex or rare earth metal complex described later) is bonded. In these polymer structures, the phosphorescent moiety may be incorporated into the main chain or into the side chain.

Other examples of the polymer structure for the phosphorescence-emitting polymer compound include polymer structures comprising a non-conjugated polymer skeleton such as polyvinylcarbazole and polysilanes, to which a phosphorescent moiety is bonded. In these polymer structures, the phosphorescent moiety may be incorporated into the main chain or into the side chain.

Still other examples of the polymer structure for the phosphorescence-emitting polymer compound include dendrimers having a phosphorescent moiety. In this case, the phosphorescent moiety may be incorporated into any portion of the dendrimer, that is, center core, branched portion or terminal portion.

In these polymer structures, the phosphorescence is emitted from the phosphorescent moiety bonded to the conjugated or non-conjugated skeleton, however, the phosphorescence may be emitted from the conjugated or non-conjugated skeleton itself. The phosphorescence-emitting polymer compound for use in the organic light-emitting element of the present invention is preferably a polymer comprising a non-conjugated polymer skeleton to which a phosphorescent moiety is bonded (hereinafter referred to as a "non-conjugated phosphorescence-emitting polymer"), for its material design flexibility and also in that the phosphorescence can be relatively easily emitted, that the synthesis is easy and that the solubility in solvent is high to facilitate preparation of a coating solution.

Figure 8:
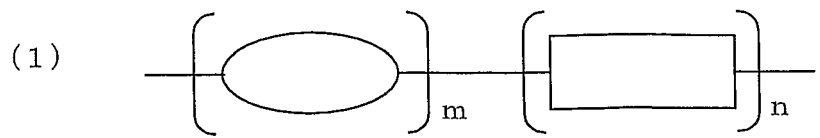
FIG. 8 shows a view showing an example of the polymer structure of the non-conjugated phosphorescence-emitting polymer used in the organic light-emitting element of the present invention.
Figure 8:
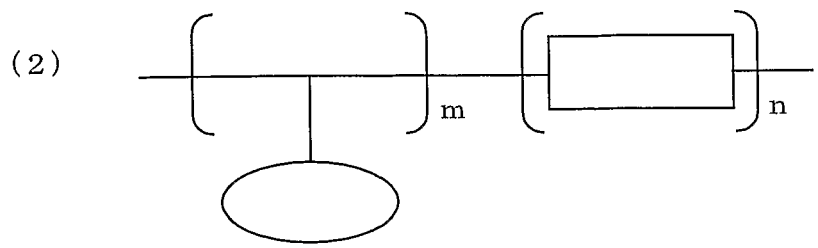
Figure 8:
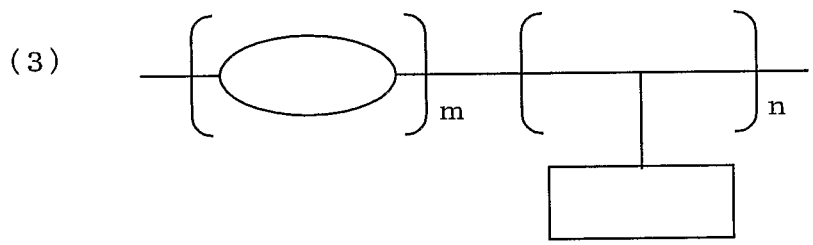
Figure 8:
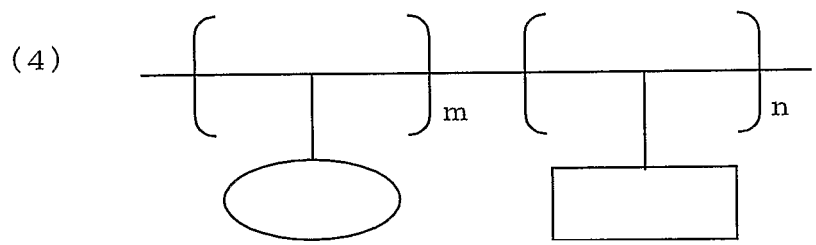
Figure 8:
Figure 8:

The non-conjugated phosphorescence-emitting polymer consists of a phosphorescence-emitting moiety and a carrier-transporting moiety. Representative examples of the polymer structure include, as shown in FIG. 8, according to the bonded state of phosphorescence-emitting moiety and carrier-transporting moiety, (1) a structure where both the phosphorescence-emitting moiety and the carrier-transporting moiety are present in the polymer main chain, (2) a structure where the phosphorescence-emitting moiety is present on the polymer side chain and the carrier-transporting moiety is present in the polymer main chain, (3) a structure where the phosphorescence-emitting moiety is present in the polymer main chain and the carrier-transporting moiety is present on the polymer side chain, and (4) a structure where both the phosphorescence-emitting moiety and the carrier-transporting moiety are present on the polymer side chain. The polymer structure may have a crosslinked structure.

The non-conjugated phosphorescence-emitting polymer may have two or more kinds of phosphorescence-emitting moieties (each may be present in the main chain or on the side chain) or may have two or more kinds of carrier-transporting moieties (each may be present in the main chain or on the side chain).

The molecular weight of the non-conjugated phosphorescence-emitting polymer is, in terms of the weight average molecular weight, preferably from 1,000 to 100,000, more preferably from 5,000 to 50,000.

As for the phosphorescence-emitting moiety, a monovalent group or a divalent or greater polyvalent group of a compound which emits phosphorescence at room temperature may be used, and a monovalent or divalent group of transition metal complex or rare earth metal complex is preferred. Examples of the transition metal for use in the transition metal complex include the first transition element series of the Periodic Table, namely, from Sc of atomic number 21 to Zn of atomic number 30, the second transition element series, namely from Y of atomic number 39 to Cd of atomic number 48, and the third transition element series, namely from Hf of atomic number 72 to Hg of atomic number 80. Examples of the rare earth metal for use in the rare earth metal complex include the lanthanoid series of the Periodic Table, namely, from La of atomic number 57 to Lu of atomic number 71.

Examples of the ligand which can be used for the transition metal complex or rare earth metal complex include ligands described in G. Wilkinson (Ed.), Comprehensive Coordination Chemistry, Plenum Press (1987), and Akio Yamamoto, Yuki Kinzoku Kagaku-Kiso to Oyo- (Organic Metal Chemistry—Fundamentals and Applications—), Shokabo (1982). Among these, preferred are halogen ligands, nitrogen-containing heterocyclic ligands (e.g., phenylpyridine-based ligand, benzoquinoline-based ligand, quinolinol-based ligand, bipyridyl-based ligand, terpyridine-based ligand and phenanthroline-based ligand), diketone ligands (e.g., acetylacetone ligand and dipivaloylmethane ligand), carboxylic acid ligands (e.g., acetic acid ligand), phosphorus ligands (e.g., triphenylphosphine-based ligand and phosphite-based ligand), carbon monoxide ligands, isonitrile ligands and cyano ligands. One metal complex may contain multiple ligands. Also, the metal complex may be a binuclear or polynuclear complex.

As for the carrier-transporting moiety, a monovalent group or a group having two or more valences of a hole-transporting compound, an electron-transporting compound or a bipolar compound which transports both holes and electrons may be used. Examples of the carrier transporting moiety for hole-transporting include a monovalent or divalent group of carbazole, triphenylamine and TPD (N,N'-diphenyl-N,N'-(3-methylphenyl)-1,1'-biphenyl-4,4'-diamine). Examples of the carrier transporting moiety for electron-transporting include a monovalent or divalent group of quinolinol derivative metal complexes such as $Alq_3$ (aluminum tris-quinolinol), oxadiazole derivatives, triazole derivatives, imidazole derivatives and triazine derivatives. Examples of the bipolar carrier transporting moiety include a monovalent or divalent group of CBP (4,4'-N,N'-dicarbazole-biphenyl).

In the organic light-emitting element of the present invention, the light-emitting layer can be formed only of the above-described phosphorescence-emitting polymer compound. The light-emitting layer may also be formed of a composition prepared by mixing a phosphorescence-emitting polymer compound with another carrier-transporting compound so as to compensate for the carrier transporting property of the phosphorescence-emitting polymer compound. That is, when the phosphorescence-emitting polymer compound has a hole transporting property, an electron-transporting compound may be mixed therewith and when the phosphorescence-emitting polymer compound has an electron transporting property, a hole-transporting compound may be mixed therewith. The carrier-transporting compound mixed with the phosphorescence-emitting polymer compound may be either a low molecular compound or a polymer compound.

Examples of the low-molecular hole-transporting compound which can be mixed with the phosphorescence-emitting polymer compound include known hole transporting materials including triphenylamine derivatives such as TPD (N,N'-diphenyl-N,N'-(3-methylphenyl)-1,1'-biphenyl-4,4'-diamine), α-NPD (4,4'-bis[N-(1-naphthyl)-N-phenylamino]biphenyl) and m-MTDATA (4,4',4"-tris(3-methylphenylphenylamino)triphenylamine).

Examples of the polymer hole-transporting compound which can be mixed with the phosphorescence-emitting polymer compound include those obtained by introducing a polymerizable functional group into a polyvinylcarbazole or triphenylamine-based low-molecular compound to convert the low-molecular compound into a polymer compound, such as polymer compounds having a triphenylamine skeleton disclosed in JP-A-8-157575.

Examples of the low-molecular electron-transporting compound which can be mixed with the phosphorescence-emitting polymer compound include quinolinol derivative metal complexes such as $Alq_3$ (aluminum tris-quinolinol), oxadiazole derivatives, triazole derivatives, imidazole derivatives and triazine derivatives.

Examples of the polymer electron-transporting compound which can be mixed with the phosphorescence-emitting polymer compound include those obtained by introducing a polymerizable functional group into the above-described low-molecular electron-transporting compound to convert the low-molecular compound into a polymer compound, such as polyPBD disclosed in JP-A-10-1665.

For the purpose of improving the physical properties and the like of the film obtained by film-forming the phosphorescence-emitting polymer compound, a composition prepared by mixing a polymer compound not directly participating in the light-emitting property of the phosphorescence-emitting polymer compound may be used as the light-emitting material. For example, PMMA (polymethyl methacrylate) or polycarbonate may be mixed so as to impart flexibility to the obtained film.

The thickness of the light-emitting layer is preferably from 1 nm to 1 μm, more preferably from 5 to 300 nm, still more preferably from 10 to 100 nm.

In the organic light-emitting element of the present invention, examples of the hole transporting material for forming the hole transporting layer include known low-molecular hole transporting materials such as triphenylamine derivatives (e.g., TPD (N,N'-dimethyl-N,N'-(3-methylphenyl)-1,1'-biphenyl-4,4'-diamine), α-NPD (4,4'-bis[N-(1-naphthyl)-N-phenylamino]biphenyl), m-MTDATA (4,4',4"-tris(3-methylphenylphenylamino)triphenylamine)) and polyvinylcarbazole.

A polymer hole transporting material can also be used and examples thereof include those obtained by introducing a polymerizable functional group into a triphenylamine-based low-molecular compound to convert it into a polymer compound, such as polymer compounds having a triphenylamine skeleton disclosed in JP-A-8-157575, and polymer materials such as polyparaphenylenevinylene and polydialkylfluorene.

Such a hole transporting material can be used alone but may be used by mixing or stacking it with another hole transporting material.

The thickness of the hole transport layer is preferably from 1 nm to 5 μm, more preferably from 5 nm to 1 μm, still more preferably from 10 to 500 nm.

In the organic light-emitting element of the present invention, examples of the electron transporting material for forming the electron transporting layer include known low-molecular electron transporting materials such as quinolinol derivative metal complexes (e.g., $Alq_3$ (aluminum tris-quinolinol)), oxadiazole derivatives, triazole derivatives, imidazole derivatives and triazine derivatives.

A polymer electron transporting material may also be used and examples thereof include those obtained by introducing a polymerizable functional group into the above-described low-molecular electron-transporting compound to convert it into a polymer compound, such as polyPBD disclosed in JP-A-10-1665.

Such an electron transporting material can be used alone but may be used by mixing or stacking it with another electron transporting material.

The thickness of the electron transporting layer is preferably from 1 nm to 5 μm, more preferably from 5 nm to 1 μm, still more preferably from 10 to 500 nm.

The phosphorescence-emitting polymer compound used for the light-emitting layer, the hole transporting material used for the hole transporting layer, and the electron transporting material used for the electron transporting layer each may constitute the layer by itself or by using a polymer material as the binder. Examples of the polymer material used as the binder include polymethyl methacrylate, polycarbonate, polyester, polysulfone and polyphenylene oxide.

The light-emitting layer, hole transporting layer and electron transporting layer may be formed by resistance heating vapor deposition method, electron beam vapor deposition method, sputtering method, inkjet method, spin coating method, dip coating method, printing method, spray method, dispenser method or the like. In the case of a low-molecular compound, the resistance heating vapor deposition method or electron beam vapor deposition method is mainly used and in the case of a polymer compound, the inkjet method or spin coating method is mainly used.

For the purpose of allowing for efficient recombination of holes with electrons by preventing holes from passing through the light-emitting layer, a hole-blocking layer may be provided in adjacent to the cathode side of the light-emitting layer. For this layer, a compound having a deeper HOMO level than that of the light-emitting material can be used and examples thereof include triazole derivatives, oxadiazole derivatives, phenanthroline derivatives and aluminum complexes.

Furthermore, for the purpose of preventing an exciton from being deactivated by the cathode metal, an exciton-blocking layer may be provided in adjacent to the cathode side of the light-emitting layer. For this layer, a compound having a larger excited triplet energy than that of the light-emitting material can be used and examples thereof include triazole derivatives, phenanthroline derivatives and aluminum complexes.

As for the anode material which can be used for the light-emitting element of the present invention, a known transparent electrically conducting material may be used and examples thereof include electrically conducting polymers such as ITO (indium tin oxide), tin oxide, zinc oxide, polythiophene, polypyrrole and polyaniline. The surface resistance of the electrode formed of this transparent electrically conducting material is preferably from 1 to 50 Ω/square (ohm/square).

Such an anode material may be film-formed by the electron beam vapor deposition method, sputtering method, chemical reaction method, coating method or the like. The thickness of the anode is preferably from 50 to 300 nm.

As for the cathode material for the organic light-emitting element of the present invention, a material having a low work function and being chemically stable is used and examples thereof include known cathode materials such as Al, MgAg alloy and Al-alkali metal alloy (e.g., AlLi and AlCa).

Such a cathode material may be film-formed by the resistance heating vapor deposition method, electron beam vapor deposition method, sputtering method, ion plating method or the like.

The thickness of the cathode is preferably from 10 nm to 1 μm, more preferably from 50 to 500 nm.

For the purpose of decreasing the barrier against electron injection from the cathode into the organic layer and thereby elevating the electron injection efficiency, a metal layer having a work function lower than the cathode layer may be inserted between the cathode and an organic layer adjacent to the cathode. Examples of the metal having a low work function, which can be used for this purpose, include alkali metals such as Na, K, Rb and Cs, alkaline earth metals such as Sr and Ba, and rare earth metals such as Pr, Sm, Eu and Yb. An alloy or a metal compound may also be used if its work function is lower than that of the cathode.

Such a cathode buffer layer may be film-formed by the vapor deposition method or sputtering method.

The thickness of the cathode buffer layer is preferably from 0.05 to 50 nm, more preferably from 0.1 to 20 nm, still more preferably from 0.5 to 10 nm.

The cathode buffer layer may also be formed of a mixture of the substance having a low work function with an electron transporting material. As for the electron transport material used here, the organic compounds described above for use in the electron transporting layer can be used. In this case, the film formation may be performed by the co-deposition method.

Also, in the case where the film formation can be performed by coating a solution, a film formation method such as spin coating method, dip coating method, inkjet method, printing method, spray method and dispenser method may be used. In this case, the thickness of the cathode buffer layer is preferably from 0.1 to 100 nm, more preferably from 0.5 to 50 nm, still more preferably from 1 to 20 nm.

As for the substrate of the organic light-emitting element according to the present invention, an insulating substrate transparent to light at the emission wavelength of the light-emitting material, specifically, a glass or a known material such as transparent plastics including PET (polyethylene terephthalate) and polycarbonate, can be used.

By using the organic light-emitting element in a preferred embodiment of the present invention and employing a known production method, the present invention can be applied to use for various organic EL displays, cellular phones and portable terminals including PDA.

BEST MODE FOR CARRYING OUT THE INVENTION

The present invention is described below by referring to Examples and Comparative Examples, but the scope of the present invention is not limited to these Examples. The self-doping type electrically conducting polymer compounds, electrically conducting compositions and the measuring methods of various physical properties used in the examples below are as follows.

1) Synthesis of Self-Doping Type Electrically Conducting Polymer Compound:

The self-doping type electrically conducting polymer compound, poly(5-sulfoisothianaphthene-1,3-diyl), when $R^1$ to $R^3$ and M in formula (7) are each a hydrogen atom and $B^1$ is not present to allow for direct bonding of the sulfonic acid group was synthesized according to the method disclosed in JP-A-7-48436.

The self-doping type electrically conducting polymer compound, poly(3-(3'-sulfopropyl)thiophene-2,5-diyl), when $B^1$ in formula (10) is propenylene was synthesized according to the method disclosed in JP-A-2-189333.

2) Synthesis of Crosslinking Agent, 2'-3'-quinoxalyl-bis-(4-Sodium benzenesulfonate) (Hereinafter Simply Referred to as "QBBS"):

1.3 g (6.2 mmol) of bis-benzyl (produced by Tokyo Kasei Kogyo Co., Ltd.) was dissolved in 6.4 mL of 1,4-dioxane (produced by JUNSEI CHEMICAL Co., Ltd.). 19 mL of 20% fuming sulfuric acid (produced by Yotsuhata Kagaku Kogyo Co., Ltd.) was added dropwise to the solution while cooling and stirring to maintain the solution at room temperature, and the solution was stirred overnight. Then, after the reaction solution was poured into ice water and diluted, 67 g of powdery sodium hydrogen carbonate was added thereto little by little to neutralize the solution, and precipitated colorless crystal was filtered out. Water was removed from the filtrate under reduced pressure to obtain 30 g of pale-green solid. To this was added 90 mL of N,N-dimethylformamide and stirred overnight. Then, to a filtrate obtained by filtration for separating out solid content from the suspension was added 0.66 g (6.1 mmol) of orthophenylenediamine, and the resulting solution was heated at 120° C. for 10 hours. The reaction solution was added to 450 mL of acetone and the solid precipitate was separated by filtration. The precipitate washed with 50 mL of acetone twice repeatedly and then recrystallized from water to obtain 0.30 g of pale-yellow needle crystal (recovery: 10%).

3) Preparation of Electrically Conducting Composition

Electrically Conducting Composition 1:
This composition was prepared by adding 100 g of ultra-pure water to 0.74 g of poly(5-sulfoisothianaphthene-1,3-diyl).

Electrically Conducting Composition 2:
This composition was prepared by adding 99.1 g of ultra-pure water to 0.9 g of poly(3-(3'-sulfopropyl)thiophene-2,5-diyl), and mixing and dissolving these.

Electrically Conducting Composition 3:
This composition was prepared by adding 97.0 g of ultra-pure water to 3.0 g of poly(3-(3'-sulfopropyl)thiophene-2,5-diyl), and mixing and dissolving these.

Electrically Conducting Composition 4:
This composition was prepared by mixing 75 mL of Electrically Conducting Composition 1 with 25 mL of Electrically Conducting Composition 2.

Electrically Conducting Composition 5:
This composition was prepared by adding 10.5 g of 1N aqueous ammonia to 100 mL of an aqueous 3 mass % poly (5-sulfoisothianaphthene-1,3-diyl) solution, and adjusting the pH to 4.4.

Electrically Conducting Composition 6:
This composition was prepared by adding 9.3 g of 1N aqueous ammonia to 100 mL of an aqueous 3 mass % poly (3-(3'-sulfopropyl)thiophene-2,5-diyl) solution, and adjusting the pH to 4.0.

Electrically Conducting Composition 7:

This composition was prepared by adding 25 g of ultrapure water to 0.50 g (2.4 mmol) of poly(5-sulfoisothianaphthene-1,3-diyl) and 70 mg (0.07 mmol) of above QBBS.

Electrically Conducting Composition 8:

This composition was prepared by adding 25 g of ultrapure water to 0.50 g (2.4 mmol) of poly(5-sulfoisothianaphthene-1,3-diyl) and 0.28 g (0.48 mmol) of above QBBS.

4) Measurement of pH:

The pH of the aqueous solution of self-doping type electrically conducting polymer was measured by a glass electrode-type hydrogen ion concentration meter, pH METER F-13 (manufactured by Horiba Ltd.).

5) Preparation of Electrically Conducting Composition Film:

The electrically conducting composition film was produced by rotation-coating the composition on a surface of a quartz substrate at 1,500 rpm with use of a spinner, 1H-III (manufactured by Kyoei Semiconductor K.K.).

6) Measurement of Surface Resistance Value of Coating Film:

The surface resistance value of the electrically conducting composition film is a value measured by a surface resistance meter, MEGARESTA Model HT-301 (manufactured by Shishido Electrostatic, Ltd.). The upper limit in the measurement by this meter is $1 \times 10^{11}$ Ω/square.

7) Method of Heat Treatment:

The surface temperature of a hot plate of a reflow furnace (manufactured by Sikama International Inc.) was adjusted by actually measuring it with a surface thermometer and thereafter, the substrate having coated thereon the electrically conducting composition was heat-treated in an air atmosphere.

8) X-Ray Photoelectron Spectrometry (XPS)

The XPS measurement was performed by using AXIS-Ultra manufactured by KRATOS.

In order to specify the peak positions of various sulfur atoms, a thiophene trimer was used for the standard sample of sulfur atom originated in thiophene ring, a sodium p-toluenesulfonate was used for the standard sample of sulfur atom originated in sulfonic acid, and a phenylsulfone was used for the standard sample of sulfur atom originated in sulfone bond.

9) Evaluation of Water Resistance and Solvent Resistance:

The evaluation of water resistance and solvent resistance was performed as follows.

Ultrapure water, acetone, N-methylpyrrolidinone or polyethylene glycol monomethyl ether was dropped onto the surface of substrates after heated, in an amount of 3 mL per substrate, and left standing for 60 seconds. It was judged whether or not any of the components had dissolved out from the composition. Furthermore, the solvent dropped on the surface of the substrate was shaken off by a spinner at 1,500 rpm and then, the surface resistance value was again measured and rated according to the following criteria:

○: The electrically conducting composition film was not dissolved with water or organic solvent and the surface resistance value was not fluctuated.

Δ: The electrically conducting composition film was mostly dissolved with water or organic solvent, but a slight electrical conductivity of $1 \times 10^9$ Ω/square or more remained.

X: The electrically conducting composition film was dissolved with water or organic solvent and disappeared, and the electrical conductivity was lost, with the surface resistance showing the upper limit in measurement by MEGARESTA.

10) Pencil Hardness:

The tip of a pencil having each hardness (4H to 6B) was sharpened and vertically pressed against the electrically conducting composition film under a load of 1 kg and while applying the load, the pencil was drawn to test whether the electrically conducting composition film was scratched, thereby judging the hardness.

The production of the organic light-emitting element is described below.

Phosphorescence-emitting monomer, [6-(4-vinylphenyl)-2,4-hexanedionate]bis(2-phenylpyridine)iridium (III) (Hereinafter Simply Referred to as "IrPA")

IrPA was obtained by performing the synthesis according to the method disclosed in JP-A-2003-113246.

Synthesis of phosphorescence-emitting copolymer, poly(N-vinylcarbazole-co-[6-(4-vinylphenyl)-2,4-hexanedionate]bis(2-phenylpyridine)indium (III) (hereinafter simply referred to as "poly(VCz-co-IrPA)")

This copolymer was synthesized as a light-emitting material containing IrPA working out to a unit having a light-emitting function, and N-vinylcarbazole working out to a unit having a hole transporting function.

N-Vinylcarbazole (1.55 g (8.0 mmol)), 29 mg (0.04 mmol) of Ir(ppy)$_2$[1-(StMe)-acac] and 13 mg (0.08 mmol) of AIBN were dissolved in 40 mL of dehydrated toluene, and then argon was blown thereinto for 1 hour. The temperature of this solution was elevated to 80° C. to initiate the polymerization reaction, and the solution was stirred as is for 8 hours. After cooling, the reaction solution was added dropwise to 250 mL of methanol to precipitate the polymerization product, and the polymerization product was recovered by filtration. The recovered polymerization product was dissolved in 25 mL of chloroform, and the resulting solution was purified by adding dropwise the solution into 250 mL of methanol to effect the reprecipitation and then vacuum-dried at 60° C. for 12 hours to obtain 1.14 g of the objective poly(VCz-co-IrPA) (recovery: 72%).

Electron-Transporting Polymer Compound Represented by the Following Structural Formula (12), polyPBD:

(12)

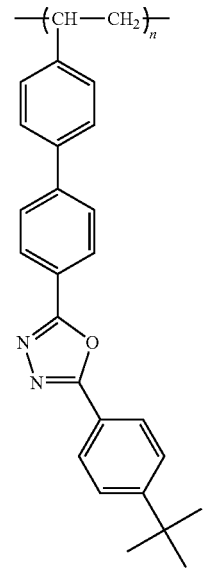

PolyTPD was obtained by performing the synthesis according to the method disclosed in JP-A-10-1665.

EXAMPLES 1 TO 9

3 mL of Electrically Conducting Composition 1 was dropped on a quartz glass (60 mm×60 mm×1 mm (thickness)) and rotation-coated at 1,500 rpm to form an electrically conducting composition film having a thickness of 22 nm.

The surface resistance value of this electrically conducting composition film was $4.0 \times 10^5$ Ω/square, and the pencil hardness was 6B or less.

Also, this electrically conducting composition film was measured by XPS, and the obtained spectrum of binding energy of S2p is shown by the dotted line in FIG. 1.

In Examples 1 to 9, the surface resistance value was measured after the quartz glass above was heated for a time period shown in Table 1 by placing it on a hot plate heated to a temperature shown in Table 1. The results are shown in Table 1.

TABLE 1

| | Heating Temperature,/° C. | Heating Time,/sec | Surface Resistance Value after Heating Ω/square | Water Resistance | Solvent Resistance |
|---|---|---|---|---|---|
| Example 1 | 250 | 60 | $6.5 \times 10^5$ | ◯ | ◯ |
| Example 2 | 250 | 120 | $2.1 \times 10^6$ | ◯ | ◯ |
| Example 3 | 250 | 900 | $2.8 \times 10^6$ | ◯ | ◯ |
| Example 4 | 300 | 120 | $2.6 \times 10^7$ | ◯ | ◯ |
| Example 5 | 300 | 300 | $6.7 \times 10^7$ | ◯ | ◯ |
| Example 6 | 300 | 900 | $2.3 \times 10^{10}$ | ◯ | ◯ |
| Example 7 | 310 | 60 | $2.0 \times 10^6$ | ◯ | ◯ |
| Example 8 | 330 | 60 | $4.0 \times 10^6$ | ◯ | ◯ |
| Example 9 | 350 | 60 | $1.5 \times 10^7$ | ◯ | ◯ |

Furthermore, the electrically conducting composition film after heat treatment produced in Example 2 was measured by XPS, and the obtained spectrum of binding energy of S2p is shown by the one-dot chain line in FIG. 1.

The electrically conducting composition film after heat treatment produced in Example 4 was measured by XPS, and the obtained spectrum of binding energy of S2p is shown by the solid line in FIG. 1.

The pencil hardness of the electrically conducting composition film after heat treatment produced in Example 1 was "HB".

The pencil hardness of the electrically conducting composition films after heat treatment produced in Examples 3 to 9 was 4H or more.

EXAMPLE 10

3 mL of Electrically Conducting Composition 2 was dropped on a quartz glass (60 mm×60 mm×1 mm (thickness)) and rotation-coated at 1,500 rpm to form an electrically conducting composition film having a thickness of 5 nm.

The surface resistance value of this electrically conducting composition film was $1.7 \times 10^7$ Ω/square, and the pencil hardness was 6B or less.

Figure 2:
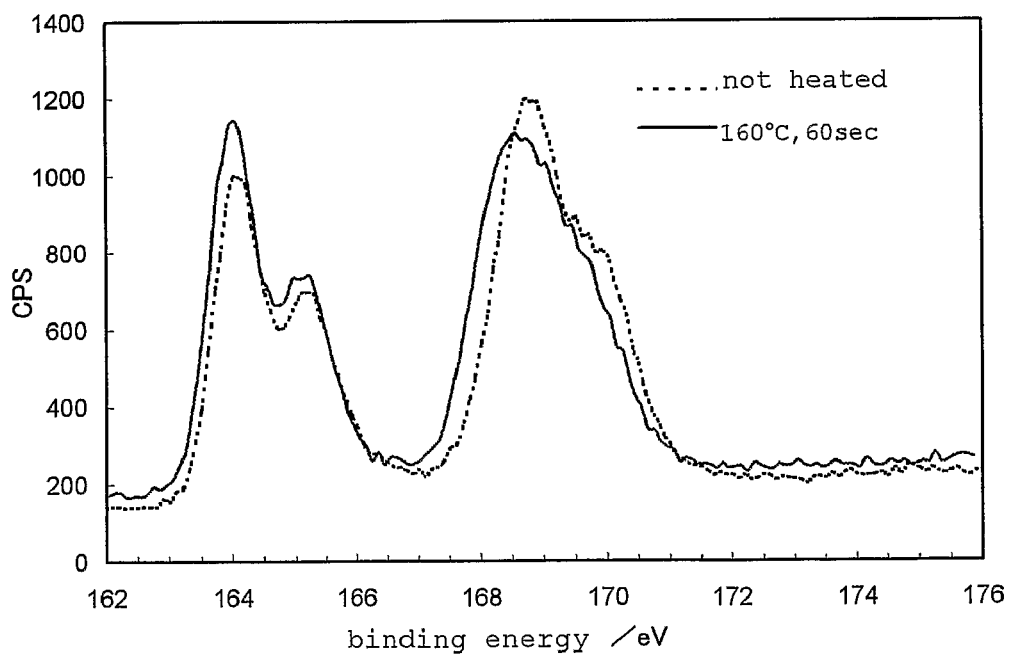
FIG. 2 shows a spectrum of binding energy of S2p obtained when the coating film of Electrically Conducting Composition 2 was measured by XPS; the dotted line is a spectrum for electrically conducting composition film before heat treatment (not heated), and the solid line is a spectrum for electrically conducting composition film after heat treatment (160° C., 60 seconds) produced in Example 10.

Also, this electrically conducting composition film was measured by XPS, and the obtained spectrum of binding energy of S2p is shown by the dotted line in FIG. 2. In FIG. 2, the solid line shows the spectrum of the electrically conducting composition film after heat treatment (160° C., 60 seconds) obtained in Example 10.

This electrically conducting composition film was heated for a time period shown in Table 2 and then measured for the surface resistance value. The result is shown in Table 2.

EXAMPLES 11 TO 12

The quartz glass above was heated for a time period shown in Table 2 by placing it on a hot plate heated to a temperature shown in Table 2 in the same manner as in Example 10, except that Electrically Conducting Composition 3 was used, and then the surface resistance value was measured. The results are shown in Table 2. The thickness of these electrically conducting composition films was 62 nm, the surface resistance value was $1.2 \times 10^6$ Ω/square, and the pencil hardness was 4B.

TABLE 2

| | Heating Temperature,/° C. | Heating Time,/sec | Surface Resistance Value after Heating, Ω/square | Water Resistance | Solvent Resistance |
|---|---|---|---|---|---|
| Example 10 | 160 | 60 | $3.2 \times 10^8$ | ◯ | ◯ |
| Example 11 | 150 | 120 | $3.0 \times 10^5$ | ◯ | ◯ |
| Example 12 | 200 | 120 | $1.5 \times 10^6$ | ◯ | ◯ |

EXAMPLES 13 TO 14

3 mL of Electrically Conducting Composition 4 was dropped on a quartz glass (60 mm×60 mm×1 mm (thickness)) and rotation-coated at 1,500 rpm to form an electrically conducting composition film having thickness of 19 nm.

The surface resistance value of the electrically conducting composition film was $1.0 \times 10^7$ Ω/square and the pencil hardness was 6B or less.

The surface resistance values of the electrically conducting composition film measured after heated for a time period shown in Table 3 were shown in Table 3.

TABLE 3

| | Heating Temperature,/° C. | Heating Time,/sec | Surface Resistance Value after Heating, Ω/square | Water Resistance | Solvent Resistance |
|---|---|---|---|---|---|
| Example 13 | 200 | 60 | $5.7 \times 10^6$ | ◯ | ◯ |
| Example 14 | 300 | 60 | $2.0 \times 10^7$ | ◯ | ◯ |

EXAMPLES 15 TO 16

3 mL of Electrically Conducting Composition 7 and Electrically Conducting Composition 8 were each dropped on a quartz glass (60 mm×60 mm×1 mm (thickness)) respectively and rotation-coated at 1,500 rpm to form an electrically conducting composition film having thickness of 31 nm each.

The surface resistance values of the electrically conducting composition films were $1.9 \times 10^6$ Ω/square in Example 15 and $7.6 \times 10^6$ Ω/square in Example 16 respectively.

Figure 3:
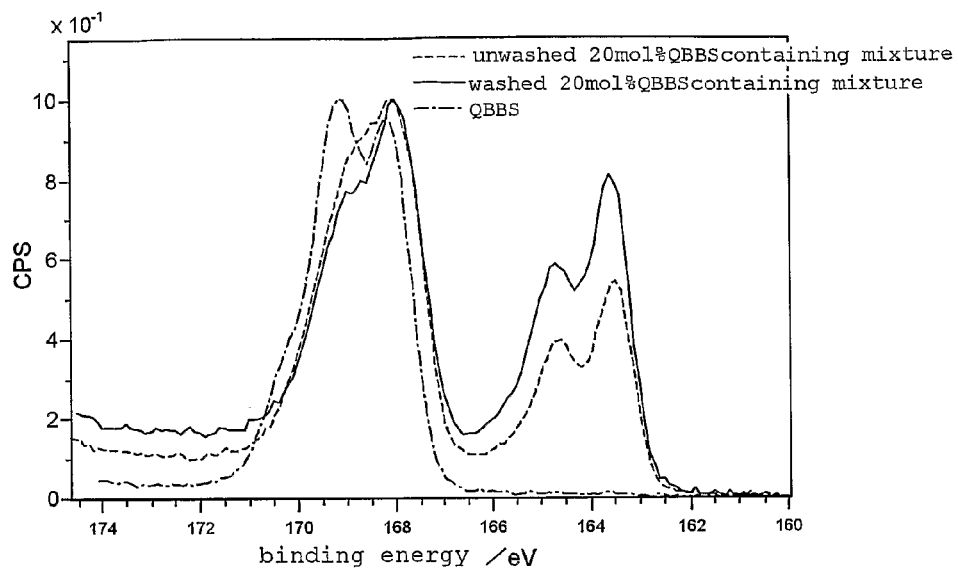
FIG. 3 shows a spectrum of binding energy of S2p obtained when the coating film of Electrically Conducting Composition 8 was measured by XPS; the dotted line is a spectrum for unwashed electrically conducting composition film after heat treatment (275° C., 60 seconds), the solid line is a spectrum for electrically conducting composition film which washed after heat treatment, and the one-dot chain line is a spectrum for sodium 2,3'-quinoxalyl-bis(4-benzenesulfonate) (QBBS).
Figure 4:
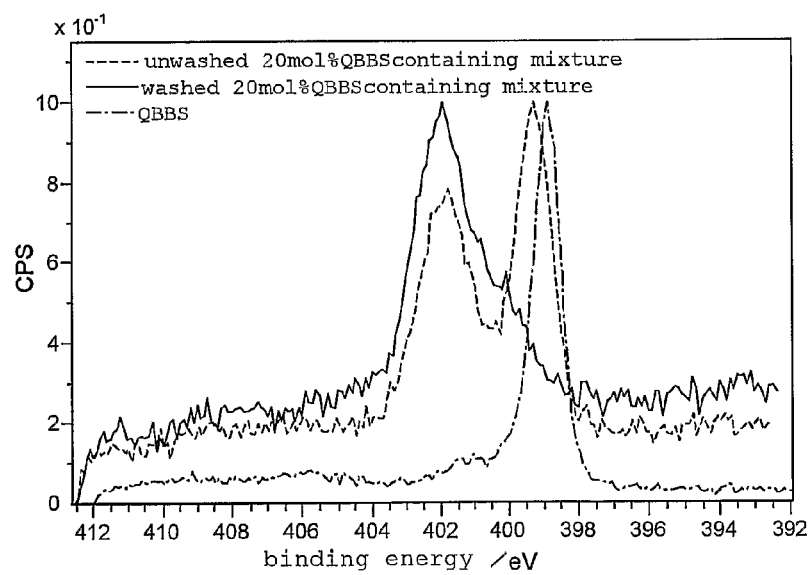
FIG. 4 shows a spectrum of binding energy of N1s obtained when the coating film of Electrically Conducting Composition 8 was measured by XPS; the dotted line is a spectrum for unwashed electrically conducting composition film after heat treatment (275° C., 60 seconds), the solid line is a spectrum for electrically conducting composition film which washed after heat treatment, and the one-dot chain line is a spectrum for QBBS.

The electrically conducting composition film formed in Example 16 was measured by XPS, and the obtained spectrum of binding energy of S2p and N1s are shown by the dotted line in FIG. 3 and FIG. 4 respectively. In FIG. 3 and FIG. 4, the solid line shows the spectrum of the binding energy of S2p and N1s of the present electrically conducting composition film after 3 mL of distilled water was dropped thereon and the film was left standing for 60 seconds, then the water was shaken off. Furthermore, each one-dot chain line in FIG. 3 and FIG. 4 shows the spectrum of the binding energy of S2p and N1s of QBBS. Peaks based on the binding energy of N1s originated in the crosslinking agent obtained by measuring before and after washing with distilled water disappeared, whereas the peak based on the binding energy of N1s originated in the crosslinked QBBS did not disappear.

This electrically conducting composition film was heated for a time period shown in Table 4 and then measured for the surface resistance value. The result is shown in Table 4.

TABLE 4

|  | Heating Temperature/° C. | Heating Time./sec | Surface Resistance Value after Heating, Ω/square | Water Resistance | Solvent Resistance |
| --- | --- | --- | --- | --- | --- |
| Example 15 | 275 | 60 | $2.3 \times 10^6$ | ○ | ○ |
| Example 16 | 275 | 60 | $4.4 \times 10^6$ | ○ | ○ |

Figure 5:
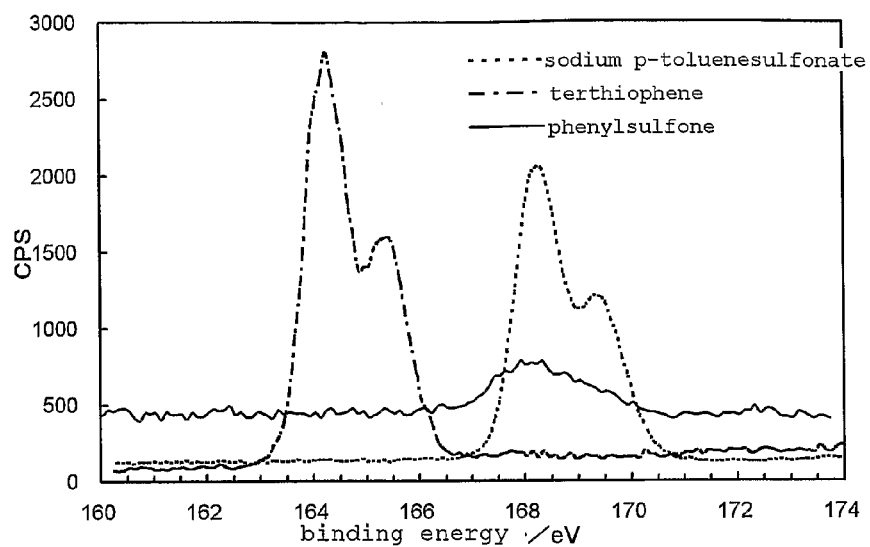
FIG. 5 shows a spectrum of binding energy of S2p obtained by XPS measurement; the solid line is a spectrum for phenylsulfone, the one-dot chain line is a spectrum for 2,2',5',2"-terthiophene, and the dotted line is a spectrum for sodium p-toluenesulfonate.

For reference, 2,2',5,2''-terthiophene (produced by Lancaster), sodium p-toluenesulfonate (produced by Kanto Chemical Co., Inc.) and phenylsulfone (produced by Tokyo Kasei Kogyo Co., Ltd.) were measured by XPS, and the obtained spectra of the binding energy of S2p are shown by the one-dot chain line, the dotted line and the solid line, respectively, in FIG. 5.

EXAMPLE 17

Production and Light-Emitting Properties of Organic Light-Emitting (Fluorescence-Emitting) Element Using Self-Doping Type Polyisothianaphthene for Anode Buffer Layer:

An organic light-emitting element was produced by using a substrate with ITO (indium tin oxide) (manufactured by Nippo Electric Co., Ltd.) where two 4 mm-width ITO electrodes working out to anode were stripedly formed on one surface of a 25 mm-square glass substrate. Electrically Conducting Composition 5 was coated on the substrate with ITO by a spin coater (3,000 rpm, 30 seconds) and heat-treated at 250° C. for 120 seconds to form an anode buffer layer containing a structure crosslinked through a sulfone bond (hereinafter, this buffer layer is simply referred to as "SD-PITN-SO$_2$"). The thickness of the obtained anode buffer layer was about 30 nm. Thereafter, a coating solution for forming the light-emitting layer was prepared. That is, 45 mg of poly(2-methoxy-5-(2'-ethylhexyloxy)-1,4-phenylenevinylene) (hereinafter simply referred to as "MEH-PPV") (ADS100RE, produced by American Dye Source Inc.) was dissolved in 2,955 mg of tetrahydrofuran (guaranteed, produced by Wako Pure Chemical Industries, Ltd.), and the resulting solution was filtered through a filter having a pore diameter of 0.2 μm to prepare a coating solution. The prepared coating solution was coated on the anode buffer layer by spin coating under the conditions such that the rotation number was 3,000 rpm and the coating time was 30 seconds, and then dried at 140° C. for 30 minutes to form a light-emitting layer. The thickness of the obtained light-emitting layer was about 100 nm. Thereafter, the substrate having formed thereon the light-emitting layer was placed in a vapor deposition apparatus, and calcium was vapor-deposited to a thickness of 25 nm at a vapor deposition rate of 0.1 nm/sec, and then aluminum as the cathode was vapor-deposited to a thickness of 250 nm at a vapor deposition rate of 1 nm/sec.

Here, the calcium and aluminum layers were formed in two 3 mm-width stripes orthogonal to the direction in which the anode was extending. Finally, a lead wire was fixed to the anode and cathode under an argon atmosphere. In this way, four organic light-emitting elements in a size of 4 mm (length)×3 mm (width) were produced per one substrate. A voltage was applied to these organic EL elements by using a programmable DC voltage/current source, TR6143 manufactured by Advantest Corp., to cause light emission and the emission brightness was measured by a brightness meter, BM-8 manufactured by Topcon Corp. The maximum brightness, maximum external quantum efficiency and brightness half-life from the initial brightness of 100 cd/m$^2$ obtained are shown in Table 5 (each is an average value of four elements in one substrate).

EXAMPLE 18

Production and Light-Emitting Properties of Organic Light-Emitting (Phosphorescence-Emitting) Element Using Self-Doping Type Polyisothianaphthene for Anode Buffer Layer:

Organic light-emitting elements were produced in the same manner as in Example 17 except for forming the light-emitting layer as follows, and evaluated for the light-emitting properties. That is, 63.0 mg of poly(VCz-co-IrPA) prepared above and 27.0 mg of polyPBD were dissolved in 2,910 mg of toluene (guaranteed, produced by Wako Pure Chemical Industries, Ltd.), and the resulting solution was filtered through a filter having a pore diameter of 0.2 μm to prepare a coating solution. The prepared coating solution was coated on the anode buffer layer by a spin coater (3,000 rpm, 30 seconds) and then dried at 140° C. for 30 minutes to form a light-emitting layer. The thickness of the obtained light-emitting layer was about 80 nm. The maximum brightness, maximum external quantum efficiency and brightness half-life from the initial brightness of 100 cd/m$^2$ obtained are shown in Table 4 (each is an average value of four elements in one substrate).

EXAMPLE 19

Production and Light-Emitting Properties of Organic Light-Emitting (Fluorescence-Emitting) Element Using Self-Doping Type Polythiophene Containing Structure Crosslinked Through Sulfone Bond for Anode Buffer Layer:

Organic light-emitting elements were produced in the same manner as in Example 17 except that Electrically Conducting Composition 6 was coated on a substrate with ITO by a spin coater (3,000 rpm, 30 seconds) and heat-treated at 200° C. for 120 seconds to form an anode buffer layer containing a structure crosslinked through a sulfone bond (hereinafter simply referred to as "SD-PT-SO$_2$"). These elements were evaluated for the light-emitting properties as shown in Table 4.

EXAMPLE 20

Production and Light-Emitting Properties of Organic Light-Emitting (Phosphorescence-Emitting) Element Using Self-Doping Type Polythiophene Containing Structure Crosslinked Through Sulfone Bond for Anode Buffer Layer:

Organic light-emitting elements were produced in the same manner as in Example 18 except that Electrically Conducting Composition 6 was coated on a substrate with ITO by a spin coater (3,000 rpm, 30 seconds) and heat-treated at 200° C. for 120 seconds to form an anode buffer layer containing a structure crosslinked through a sulfone bond. These elements were evaluated for the light-emitting properties as shown in Table 5.

TABLE 5

| Example No. | Anode Buffer Layer | Light-Emitting Layer | Maximum Brightness (cd/m$^2$) | Maximum External Quantum Efficiency (%) | Brightness Half-Life (hr @100 cd/m$^2$) |
|---|---|---|---|---|---|
| 17 | SD-PITN-SO$_2$ | MEH-PPV | 7,500 | 2.3 | 6,500 |
| 18 | SD-PITN-SO$_2$ | poly(VCz-co-IrPA) + polyPBD | 16,100 | 5.5 | 78 |
| 19 | SD-PT-SO$_2$ | MEH-PPV | 7,100 | 1.7 | 6,600 |
| 20 | SD-PT-SO$_2$ | poly(VCz-co-IrPA) + polyPBD | 15,300 | 4.1 | 35 |

COMPARATIVE EXAMPLES 1 AND 2

An electrically conducting thin film was prepared in the same manner as in Example 1. After the quartz glass was heated for a time period shown in Table 6 by placing it on a hot plate heated to a temperature shown in Table 6, the surface resistance value was measured. The results are shown in Table 6. In Table 6, the electrically conducting polymer used is simply shown as "SD-PITN".

COMPARATIVE EXAMPLES 3 AND 4

An electrically conducting thin film was prepared in the same manner as in Example 10. After the quartz glass was heated for a time period shown in Table 6 by placing it on a hot plate heated to a temperature shown in Table 6, the surface resistance value was measured. The results are shown in Table 6.

COMPARATIVE EXAMPLES 5 AND 6

An electrically conducting composition was prepared by adding 100 g of ultrapure water to 0.7 g of poly(2-methoxy-5-sulfo-1,4-iminophenylene (in Table 6, simply shown as "SD-PAn") synthesized according to the method described in JP-A-7-196791.

Thereafter, 3 mL of this water-soluble electrically conducting polymer solution was dropped on a quartz glass (60 mm×60 mm×1 mm (thickness)) and rotation-coated at 1,500 rpm to form an electrically conducting thin film having a thickness of 50 nm. The surface resistance value of the formed electrically conducting thin film was 6.2×10$^6$ Ω/square. This electrically conducting composition film was measured by XPS, and the obtained spectrum of binding energy of S2p is shown by the dotted line in FIG. 6.

After the quartz glass was heated for a time period shown in Table 6 by placing it on a hot plate heated to a temperature shown in Table 6, the surface resistance value was measured. The results are shown in Table 6.

Figure 6:
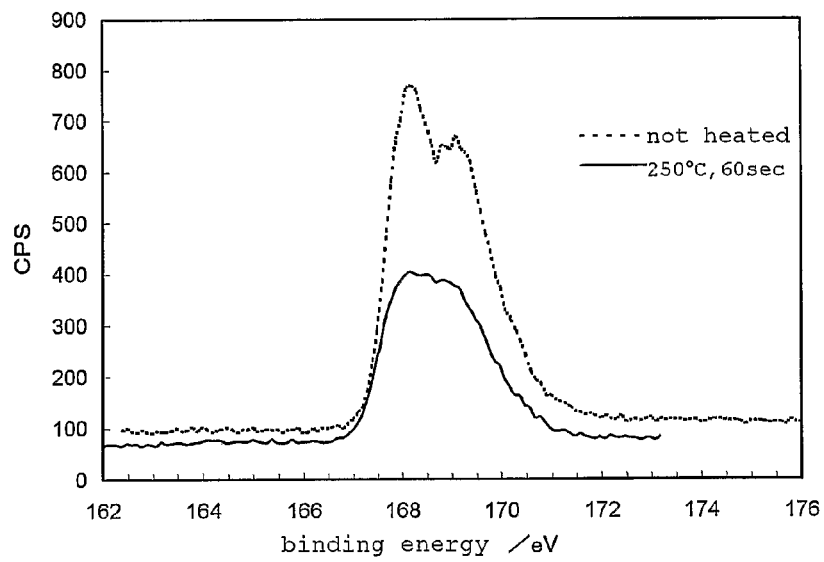
FIG. 6 shows a spectrum of binding energy of S2p obtained when the coating film of electrically conducting composition produced in Comparative Example 5 was measured by XPS; the dotted line is a spectrum for electrically conducting composition film before heat treatment (not heated), and the solid line is a spectrum for electrically conducting composition film after heat treatment (250° C., 60 seconds).

The electrically conducting composition film after heat treatment produced in Comparative Example 5 was measured by XPS, and the obtained spectrum of binding energy of S2p is shown by the solid line in FIG. 6. Generation of a new peak based on a sulfone bond was not observed.

TABLE 6

| | Heating Temperature,/ °C. | Heating Time,/ sec | Surface Resistance Value after Heating, Ω/square | Electrically Conducting Polymer Used | Water Resistance |
|---|---|---|---|---|---|
| Comparative Example 1 | 200 | 60 | 4.9 × 10$^5$ | SD-PITN | X |
| Comparative Example 2 | 200 | 900 | 1.2 × 10$^6$ | SD-PITN | Δ |
| Comparative Example 3 | 250 | 60 | 7.6 × 10$^{10}$ | SD-PT | ○ |
| Comparative Example 4 | 300 | 60 | 1.0 × 10$^{11}$ | SD-PT | ○ |
| Comparative Example 5 | 250 | 60 | 8.4 × 10$^8$ | SD-PAn | ○ |
| Comparative Example 6 | 300 | 60 | 1.0 × 10$^{11}$ | SD-PAn | ○ |

COMPARATIVE EXAMPLE 7

Production and Light-Emitting Properties of Organic Light-Emitting (Fluorescence-Emitting) Element Using Self-Doping Type polyisothianaphthene for Anode Buffer Layer:

Organic light-emitting elements were produced in the same manner as in Example 17 except that Electrically Conducting Composition 5 was coated on a substrate with ITO by a spin coater (3,000 rpm, 30 seconds) and heat-treated at 140° C. for 30 minutes to form an anode buffer layer (hereinafter simply referred to as "SD-PITN"). These elements were evaluated for the light-emitting properties. The results are shown in Table 6.

COMPARATIVE EXAMPLE 8

Production and Light-Emitting Properties of Organic Light-Emitting (Phosphorescence-Emitting) Element Using Self-Doping Type Polythiophene for Anode Buffer Layer:

Organic light-emitting elements were produced in the same manner as in Example 19 except that Electrically Conducting Composition 6 was coated on a substrate with ITO by a spin coater (3,000 rpm, 30 seconds) and heat-treated at 100° C. for 120 seconds to form an anode buffer layer (hereinafter simply referred to as "SD-PT"). These elements were evaluated for the light-emitting properties. The results are shown in Table 7.

TABLE 7

| Comparative Example | Anode Buffer Layer | Light-Emitting Layer | Maximum Brightness (cd/m²) | Maximum Outer Quantum Efficiency (%) | Brightness Half-Life (hr @100 cd/m²) |
|---|---|---|---|---|---|
| Comparative Example 7 | SD-PITN | MEH-PPV | 7,200 | 2.1 | 3,900 |
| Comparative Example 8 | SD-PT | MEH-PPV | 6,400 | 2.0 | 3,500 |

INDUSTRIAL APPLICABILITY

According to the self-doping type electrically conducting polymer in the preferred embodiments of the present invention, solvent resistance and mechanical properties can be imparted to the self-doping type electrically conducting polymer without greatly decreasing the electrical conductivity.

The self-doping type electrically conducting polymer in the preferred embodiments of the present invention is useful as an antistatic agent, an electronic device and an anode buffer layer of an organic light-emitting element.

In particular, when the crosslinked self-doping type electrically conducting polymer of the present invention is used to coat the front or back surface or over the entire surface of a silicon wafer or a compound semiconductor wafer, unexpected charge accumulated not only in the insulating compound semiconductor wafer but also in the silicon wafer which is a semiconductor, can be removed. Therefore, the present invention is useful to enhance accuracy of wafer inspection using a scanning electron microscope. The crosslinked self-doping type electrically conducting polymer of the present invention has excellent mechanical strength and therefore, even when a wafer having coated on the back surface the electrically conducting polymer is mechanically transported, the coated wafer is not damaged and therefore the electrical conductivity is not deteriorated. Furthermore, since generation of dusts is suppressed, the throughput of wafer inspection can be elevated.

On the other hand, the self-doping type electrically conducting polymer having a thiophene skeleton represented by formula (5):

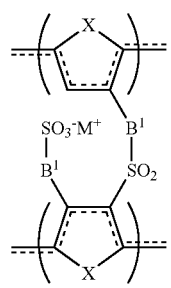

(5)

(wherein the symbols are as described above.) becomes a sulfone-crosslinked body at a relatively low temperature and therefore, when this polymer is used to coat the surface of a polymer film, a polymer fiber, a polymer substrate or a polymer resin shaped body and heat-treated, an antistatic film can be easily formed.

The invention claimed is:

1. A self-doping type electrically conducting polymer comprising crosslinked polymer chains, wherein the crosslinking is formed through a sulfone bond and the polymer contains an isothianaphthene skeleton having a sulfonic acid group.

2. The self-doping type electrically conducting polymer as claimed in claim 1, wherein the sulfone bond is contained in an amount of from 1 to 90 mol % based on the repeating unit of the polymer.

3. The self-doping type electrically conducting polymer as claimed in claim 1, wherein the polymer chains are crosslinked through a bond having a binding energy from 0.5 to 2 eV lower than the binding energy of the sulfonic acid group as measured by X-ray photoelectron spectrometry.

4. The self-doping type electrically conducting polymer as claimed in claim 1, wherein the crosslinked structure through a sulfone bond is a isothianaphthene structure represented by formula (1)'

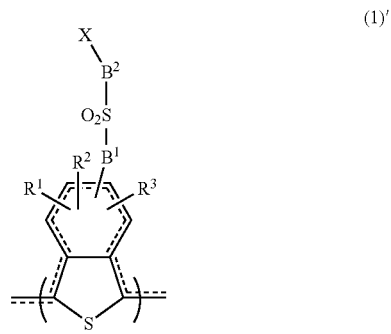

(1)' wherein $R^1$ to $R^3$ each independently represents a hydrogen atom, a linear or branched alkyl group having from 1 to 20 carbon atoms, a linear or branched alkoxy group having from 1 to 20 carbon atoms, a linear or branched alkenyl group having from 2 to 20 carbon atoms, a linear or branched alkenyloxy group having from 2 to 20 carbon atoms, a hydroxyl group, a halogen atom, a nitro group, a cyano group, a trihalomethyl group, a phenyl group, a substituted phenyl group or a —$B^1$—$SO_3^-M^+$ group, $B^1$ and $B^2$ each independently represents —$(CH_2)_p$—$(O)_q$—$(CH_2)_r$—, p and r each independently represents 0 or an integer of 1 to 3, q represents 0 or 1, X represents a polymer chain selected from the group consisting of a polypyrrole structure, a polythiophene structure, a polycarbazole structure, a polyaniline structure and an arylenevinylene structure which bonds to $B^2$ via an aromatic ring or a heterocyclic ring contained in the polymer chain, and $M^+$ represents a hydrogen ion, an alkali metal ion or a quaternary ammonium ion.

5. The self-doping type electrically conducting polymer as claimed in claim 1, wherein the crosslinked structure through a sulfone bond is a structure represented by formula (2):

(2)

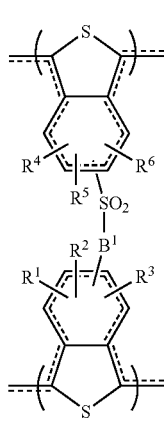

wherein R¹ to R⁶ each independently represents a hydrogen atom, a linear or branched alkyl group having from 1 to 20 carbon atoms, a linear or branched alkoxy group having from 1 to 20 carbon atoms, a linear or branched alkenyl group having from 2 to 20 carbon atoms, a linear or branched alkenyloxy group having from 2 to 20 carbon atoms, a hydroxyl group, a halogen atom, a nitro group, a cyano group, a trihalomethyl group, a phenyl group, a substituted phenyl group or a —B¹—SO₃⁻M⁺ group, B¹ represents —(CH₂)$_p$—(O)$_q$—(CH₂)$_r$—, p and r each independently represents 0 or an integer of 1 to 3, q represents 0 or 1, and M⁺ represents a hydrogen ion, an alkali metal ion or a quaternary ammonium ion.

6. The self-doping type electrically conducting polymer as claimed in claim 5, wherein the crosslinked structure through a sulfone bond is a structure represented by formula (3)

(3)

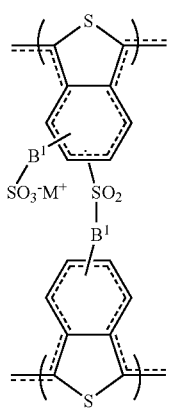

wherein B¹ represents —(CH₂)$_p$—(O)$_q$—(CH₂)$_r$—, p and r each independently represents 0 or an integer of 1 to 3, q represents 0 or 1, and M⁺ represents a hydrogen ion, an alkali metal ion or a quaternary ammonium ion.

7. A process for producing the self-doping type electrically conducting polymer containing a crosslinked structure through a sulfone bond represented by formula (2) described in claim 5, comprising dehydration-condensing self-doping type electrically conducting polymers having a structure represented by formula (7)

(7)

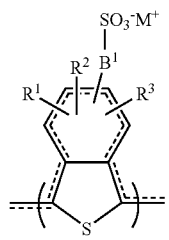

wherein R¹ to R³ each independently represents a hydrogen atom, a linear or branched alkyl group having from 1 to 20 carbon atoms, a linear or branched alkoxy group having from 1 to 20 carbon atoms, a linear or branched alkenyl group having from 2 to 20 carbon atoms, a linear or branched alkenyloxy group having from 2 to 20 carbon atoms, a hydroxyl group, a halogen atom, a nitro group, a cyano group, a trihalomethyl group, a phenyl group, a substituted phenyl group or a —B¹—SO₃⁻M⁺ group, with the proviso that at least one of R¹ to R³ is a hydrogen atom, B¹ represents —(CH₂)$_p$—(O)$_q$—(CH₂)$_r$—, p and r each independently represents 0 or an integer of 1 to 3, q represents 0 or 1, and M⁺ represents a hydrogen ion, an alkali metal ion or a quaternary ammonium ion.

8. A process for producing the self-doping type electrically conducting polymer containing a crosslinked structure through a sulfone bond represented by formula (2) described in claim 5, comprising dehydration-condensing self-doping type electrically conducting polymers having a structure represented by formula (7) and/or formula (8):

(7)

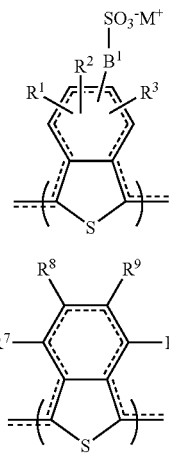

(8)

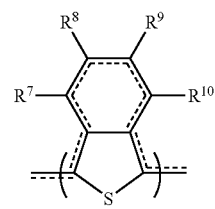

wherein R¹ to R³ and R⁷ to R¹⁰ each independently represents a hydrogen atom, a linear or branched alkyl group having from 1 to 20 carbon atoms, a linear or branched alkoxy group having from 1 to 20 carbon atoms, a linear or branched alkenyl group having from 2 to 20 carbon atoms, a linear or branched alkenyloxy group having from 2 to 20 carbon atoms, a hydroxyl group, a halogen atom, a nitro group, a cyano group, a trihalomethyl group, a phenyl group, a substituted phenyl group or a —B¹—SO₃⁻M⁺ group, with the proviso that at least one of R⁷ to R¹⁰ is a hydrogen atom, B¹ represents —(CH₂)$_p$—(O)$_q$—(CH₂)$_r$—, p and r each independently represents 0 or an integer of 1 to 3, q represents 0 or 1, and M⁺ represents a hydrogen ion, an alkali metal ion or a quaternary ammonium ion.

9. A process for producing the self-doping type electrically conducting polymer containing a crosslinked structure through a sulfone bond represented by formula (3) described in claim 6, comprising dehydration-condensing self-doping type electrically conducting polymers obtained by (co)polymerizing a monomer represented by formula (9):

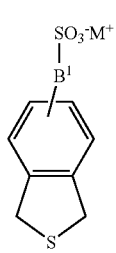

(9)

wherein $B^1$ represents $-(CH_2)_p-(O)_q-(CH_2)_r-$, p and r each independently represents 0 or an integer of 1 to 3, q represents 0 or 1, and M⁺ represents a hydrogen ion, an alkali metal ion or a quaternary ammonium ion.

10. The process for producing a self-doping type electrically conducting polymer as claimed in claim 7, wherein the dehydration condensation reaction is performed by a heat treatment at a temperature range of 210 to 350° C.

11. A self-doping type electrically conducting polymer obtained by the production process described in claim 7.

12. An electrically conducting composition comprising the self-doping type electrically conducting polymer described in claim 1, and a solvent.

13. A method for producing an electrically conducting film, comprising coating the electrically conducting composition described in claim 12 on a substrate and heating it.

14. The method for producing an electrically conducting film as claimed in claim 13, wherein the self-doping type electrically conducting polymer having a structure represented by formula (7) and/or formula (8) is applied onto a substrate surface and then the substrate is heated at a temperature of 210 to 350° C. for 1 to 600 seconds,

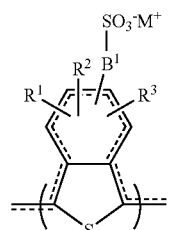

(7)

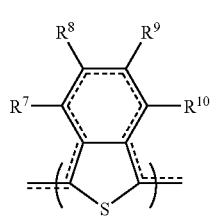

(8)

wherein $R^1$ to $R^3$ and $R^7$ to $R^{10}$ each independently represents a hydrogen atom, a linear or branched alkyl group having from 1 to 20 carbon atoms, a linear or branched alkoxy group having from 1 to 20 carbon atoms, a linear or branched alkenyl group having from 2 to 20 carbon atoms, a linear or branched alkenyloxy group having from 2 to 20 carbon atoms, a hydroxyl group, a halogen atom, a nitro group, a cyano group, a trihalomethyl group, a phenyl group, a substituted phenyl group or a $-B^1-SO_3^-M^+$ group, with the proviso that at least one of $R^7$ to $R^{10}$ is a hydrogen atom, $B^1$ represents $-(CH_2)_p-(O)_q-(CH_2)_r-$, p and r each independently represents 0 or an integer of 1 to 3, q represents 0 or 1, and M⁺ represents a hydrogen ion, an alkali metal ion or a quaternary ammonium ion.

15. The self-doping type electrically conducting polymer as claimed in claim 1, wherein one of the crosslinked polymer chains contains an isothianaphthene skeleton having a sulfonic acid group and another of the crosslinked polymer chains is selected from the group consisting of a polypyrrole structure, a polythiophene structure, a polycarbazole structure, a polyaniline structure and an arylenevinylene structure.

16. An electrically conducting film produced by the method described in claim 13.

17. The electrically conducting film as described in claim 16, wherein the film thickness is from 1 to 1,000 nm.

18. A coated product comprising a shaped body having coated on the surface thereof the self-doping type electrically conducting polymer described in claim 1.

19. A coated product comprising a substrate as a shaped body, wherein one surface, both surfaces or the entire surface of the substrate is coated with the self-doping type electrically conducting polymer described in claim 1.

20. A coated product comprising a substrate as a shaped body, wherein one surface, both surfaces or the entire surface of the substrate is coated with the electrically conducting composition described in claim 12.

21. The coated product as claimed in claim 19, wherein the substrate is a silicon wafer.

22. The coated product as claimed in claim 19, wherein the substrate is entirely or partially coated with indium tin oxide.

23. An electronic device comprising the self-doping type electrically conducting polymer described in claim 1.

24. An electronic device comprising the electrically conducting composition described in claim 12.

25. An organic light-emitting element comprising at least one light-emitting layer between a pair of anode and cathode, wherein the self-doping type electrically conducting polymer described in claim 1 is contained in the anode buffer layer.

26. The organic light-emitting element as claimed in claim 25, wherein the self-doping type electrically conducting polymer has a sulfonic acid group.

27. The organic light-emitting element as claimed in claim 25, wherein the self-doping type electrically conducting polymers are crosslinked through a sulfone bond.

28. An organic light-emitting element comprising the self-doping type electrically conducting polymer described in claim 1.

29. An organic light-emitting element comprising the electrically conducting composition described in claim 12.

30. The organic light-emitting element as claimed in claim 25, wherein the light-emitting layer comprises a fluorescence-emitting polymer material.

31. The organic light-emitting element as claimed in 25, wherein the light-emitting layer comprises a phosphorescence-emitting polymer material.

32. An organic EL display comprising the organic light-emitting element described in claim 25.

33. A display device for portable terminals, comprising the organic EL display described in claim 32.

* * * * *